(12) United States Patent
Wada

(10) Patent No.: US 7,808,054 B2
(45) Date of Patent: Oct. 5, 2010

(54) OTP MEMORY CELL, OTP MEMORY, AND METHOD OF MANUFACTURING OTP MEMORY CELL

(75) Inventor: Masahiro Wada, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 3 days.

(21) Appl. No.: 12/153,250

(22) Filed: May 15, 2008

(65) Prior Publication Data

US 2008/0283931 A1 Nov. 20, 2008

(30) Foreign Application Priority Data

May 17, 2007 (JP) .............................. 2007-131334

(51) Int. Cl.
*H01L 27/088* (2006.01)
(52) U.S. Cl. ............... 257/390; 257/379; 257/E21.666; 257/E27.085; 257/E27.102
(58) Field of Classification Search ................. 257/379, 257/390, E27.085, 27.102, E21.666
See application file for complete search history.

(56) References Cited

U.S. PATENT DOCUMENTS

| | | | | |
|---|---|---|---|---|
| 4,502,208 A | * | 3/1985 | McPherson | 438/281 |
| 5,146,307 A | * | 9/1992 | Kaya | 257/530 |
| 6,421,293 B1 | * | 7/2002 | Candelier et al. | 365/225.7 |
| 2004/0047218 A1 | * | 3/2004 | Peng | 365/221 |
| 2006/0192245 A1 | * | 8/2006 | Oosawa | 257/315 |

FOREIGN PATENT DOCUMENTS

JP 2005-504434 2/2005

* cited by examiner

*Primary Examiner*—Wael M Fahmy
*Assistant Examiner*—John C Ingham
(74) *Attorney, Agent, or Firm*—McGinn IP Law Group, PLLC

(57) ABSTRACT

An OTP memory cell according to the present invention includes: a semiconductor substrate including a lower electrode forming region having a lower electrode formed therein, a diffusion layer forming region having a source and a drain formed therein, a first trench-type insulating region, and a second trench-type insulating region; an upper electrode being in contact with the first trench-type insulating region and formed on the lower electrode with the first insulating film interposed therebetween; and a gate electrode being in contact with the second trench-type insulating region and formed on a channel region with the second insulating film interposed therebetween, in which a shape of at least a part of an end of the lower electrode forming region in contact with the first insulating film is sharper than a shape of an end of the channel region in contact with the second insulating film.

22 Claims, 46 Drawing Sheets

VOLTAGES AT TERMINALS OF OTP MEMORY CELL DURING WRITING OPERATION

| WORD LINE | BIT LINE | GATE VOLTAGE OF SELECTION TRANSISTOR | VOLTAGE AT UPPER ELECTRODE | SOURCE VOLTAGE | VOLTAGE APPLIED TO OTP MEMORY |
|---|---|---|---|---|---|
| SELECTED | SELECTED | Vg | Vbd | 0 | Vbd |
| SELECTED | NON-SELECTED | Vg | 0 | 0 | 0 |
| NON-SELECTED | SELECTED | 0 | Vbd | 0 | ABOUT Vbd/2 |
| NON-SELECTED | NON-SELECTED | 0 | 0 | 0 | 0 |

Fig. 8

VOLTAGES AT TERMINALS OF OTP MEMORY CELL DURING READING OPERATION

| WORD LINE | BIT LINE | GATE VOLTAGE OF SELECTION TRANSISTOR | VOLTAGE AT UPPER ELECTRODE | SOURCE VOLTAGE |
|---|---|---|---|---|
| SELECTED | SELECTED | Vg | Vd | 0 |
| SELECTED | NON-SELECTED | Vg | 0 | 0 |
| NON-SELECTED | SELECTED | 0 | Vd | 0 |
| NON-SELECTED | NON-SELECTED | 0 | 0 | 0 |

Fig. 9

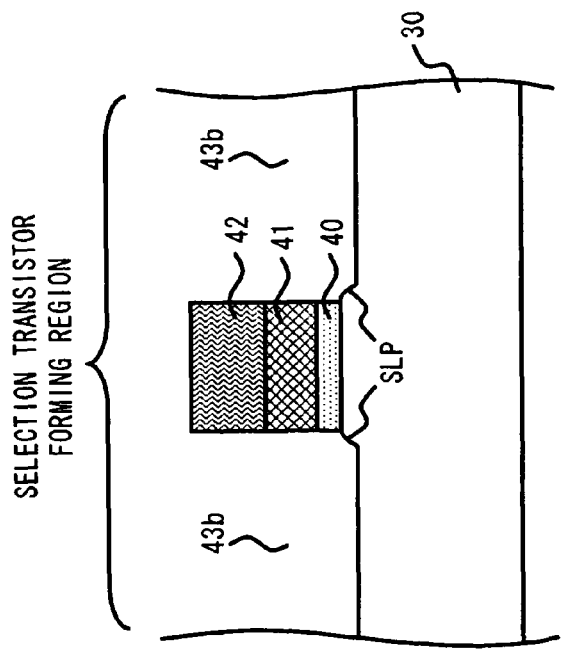
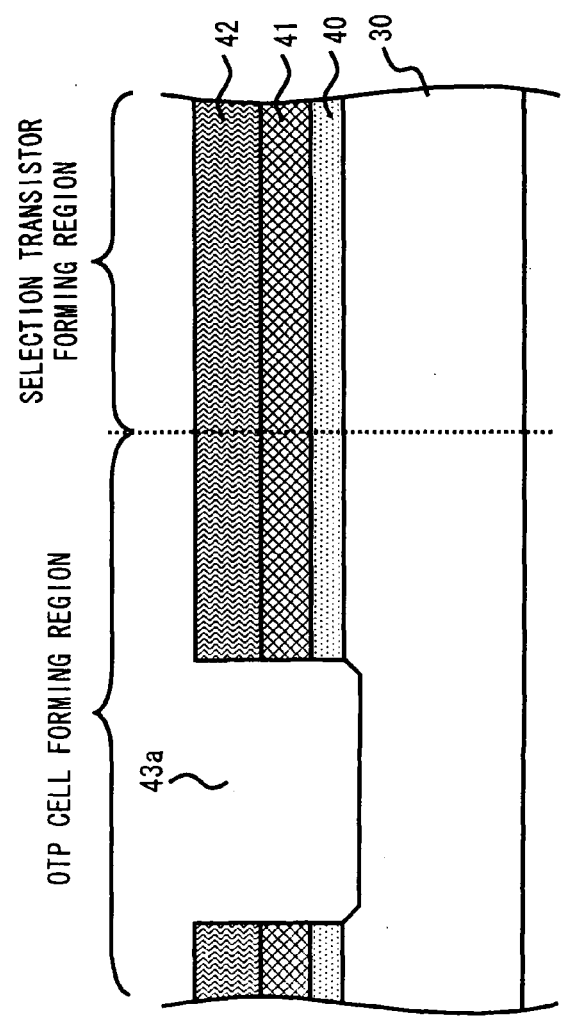

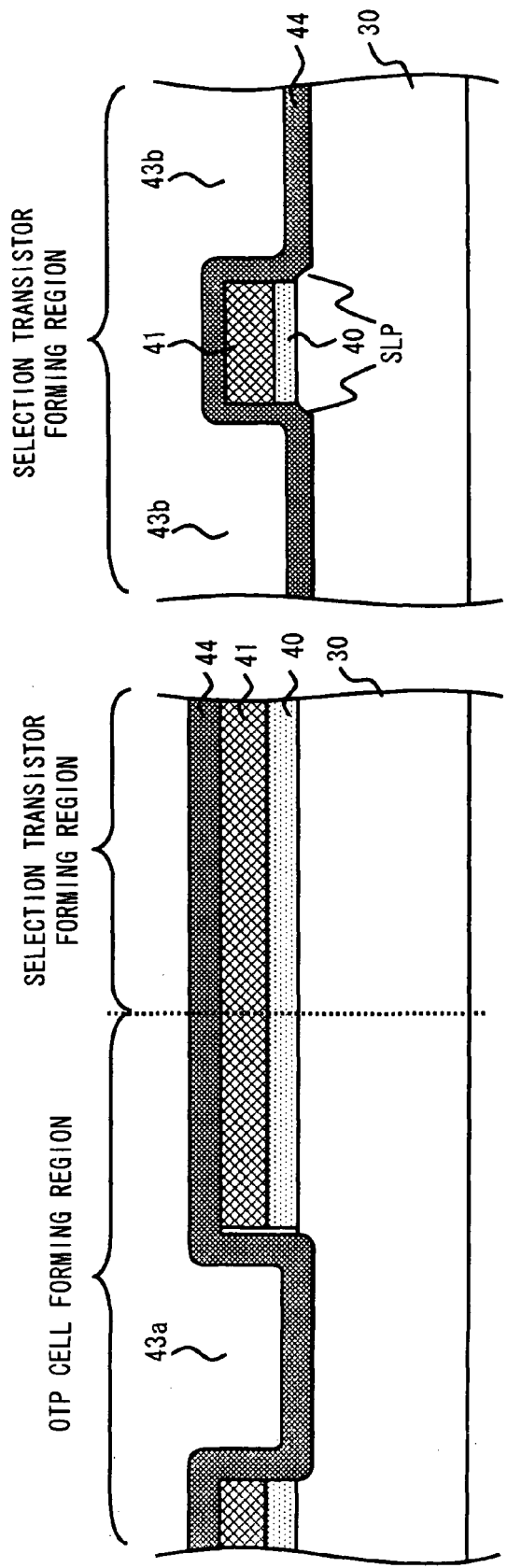

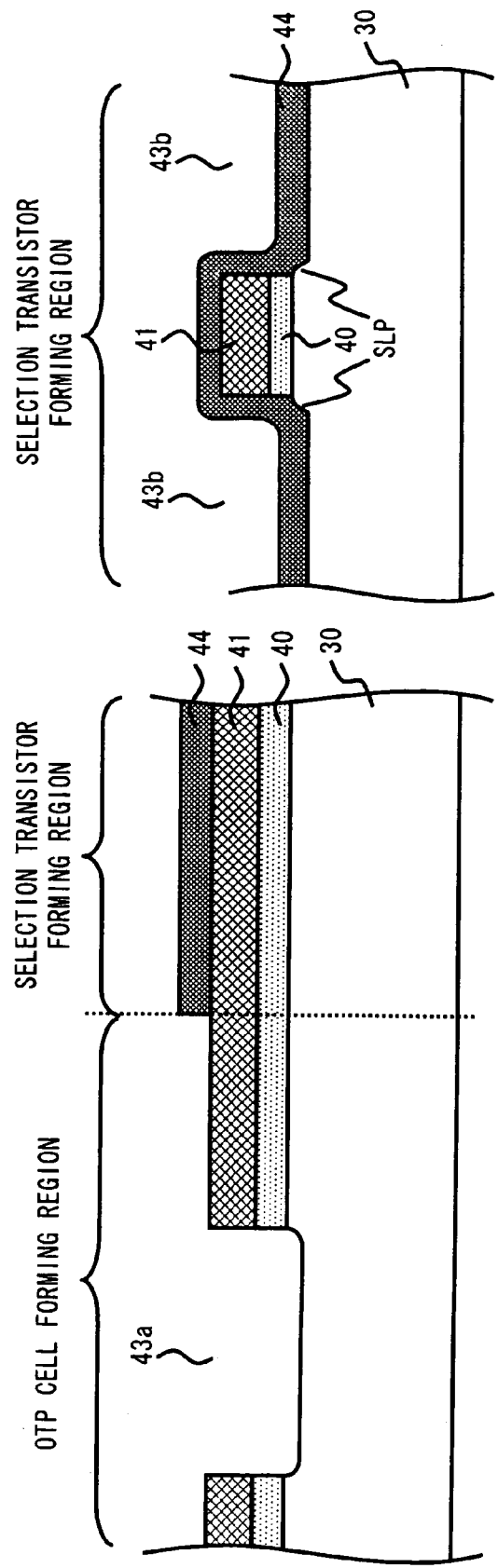

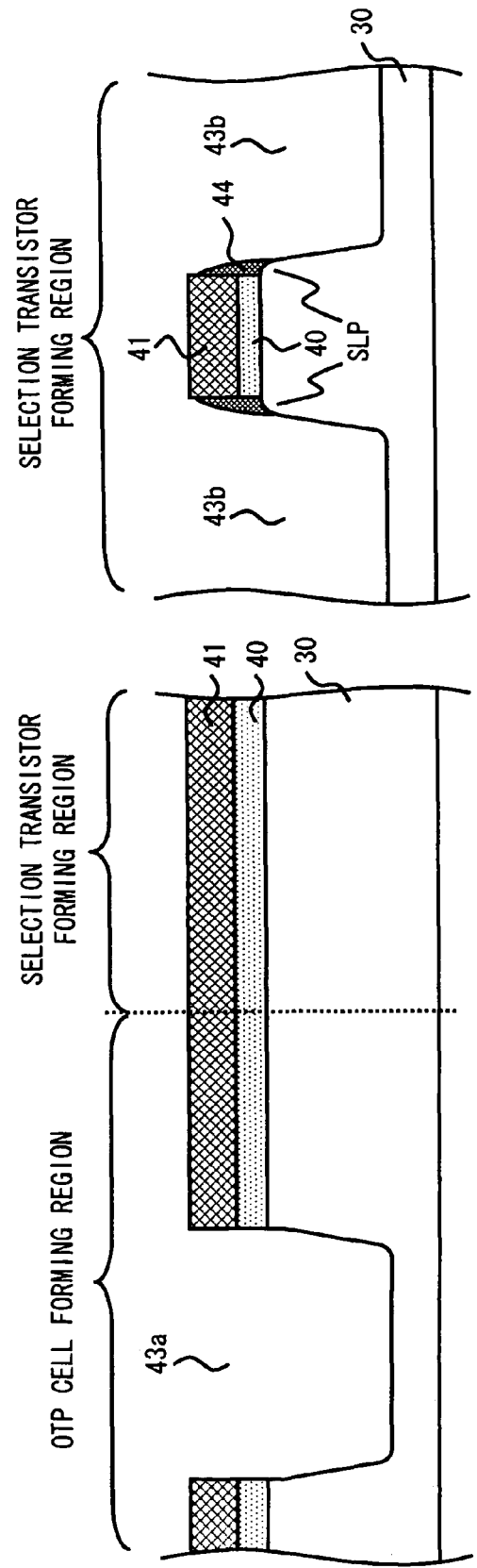

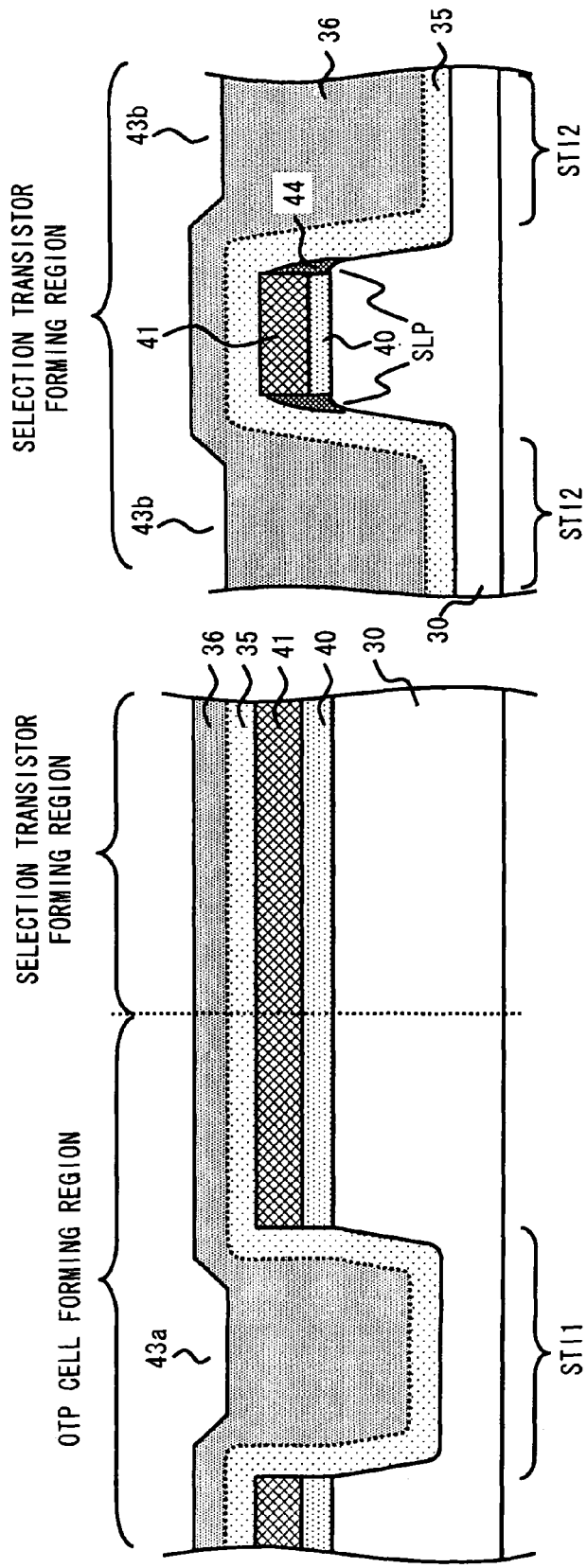

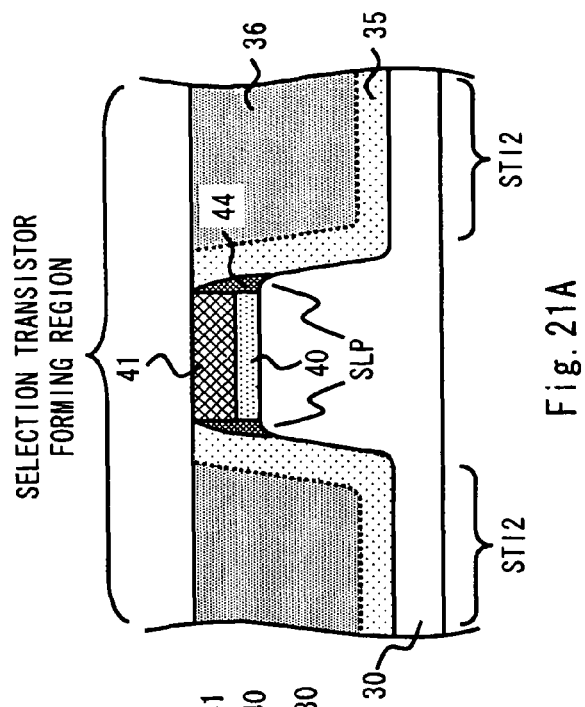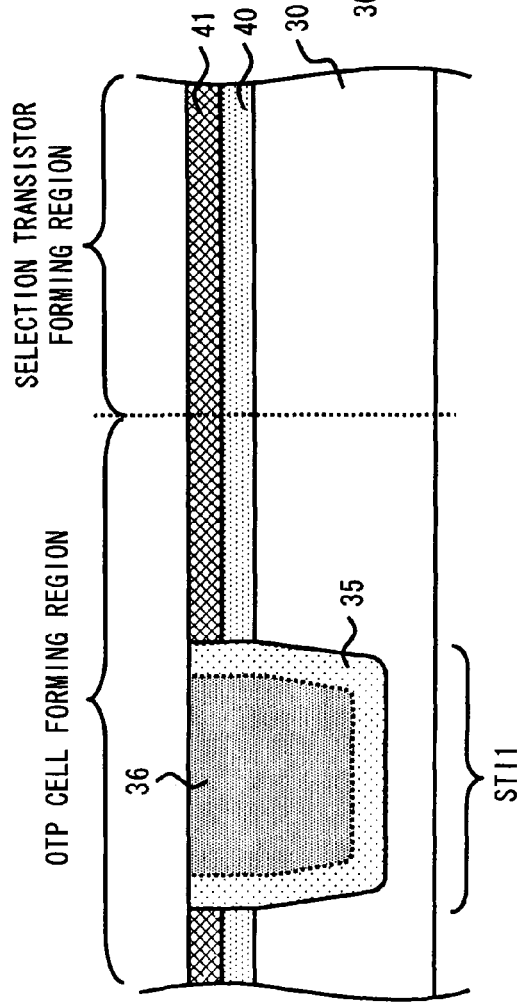
Fig. 21A

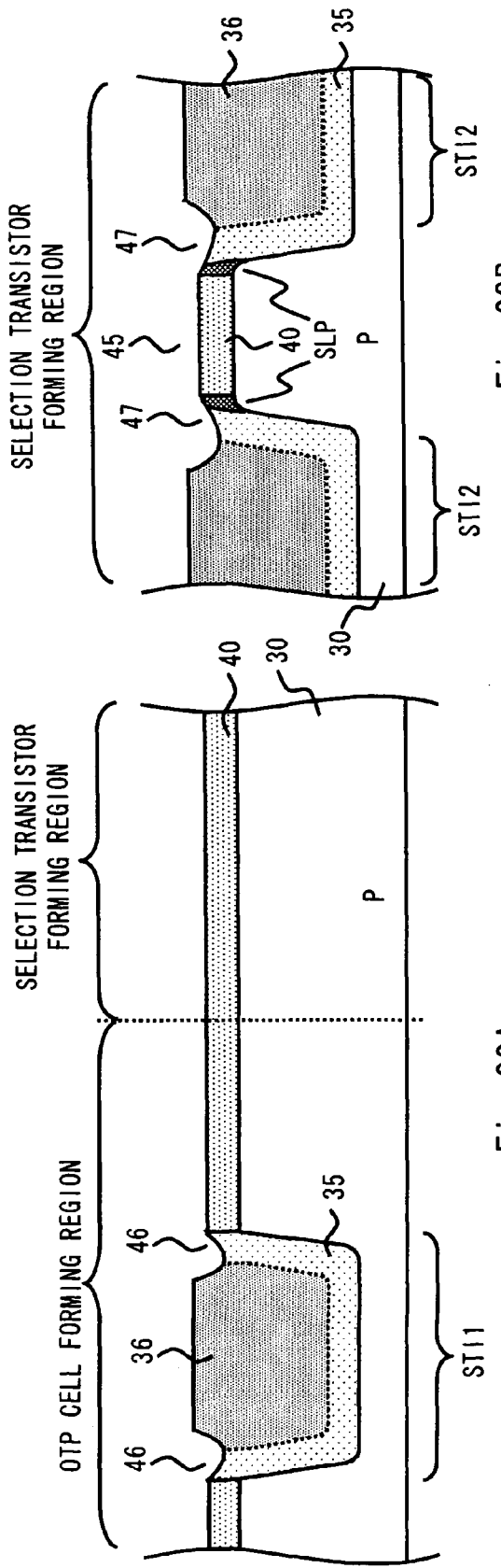

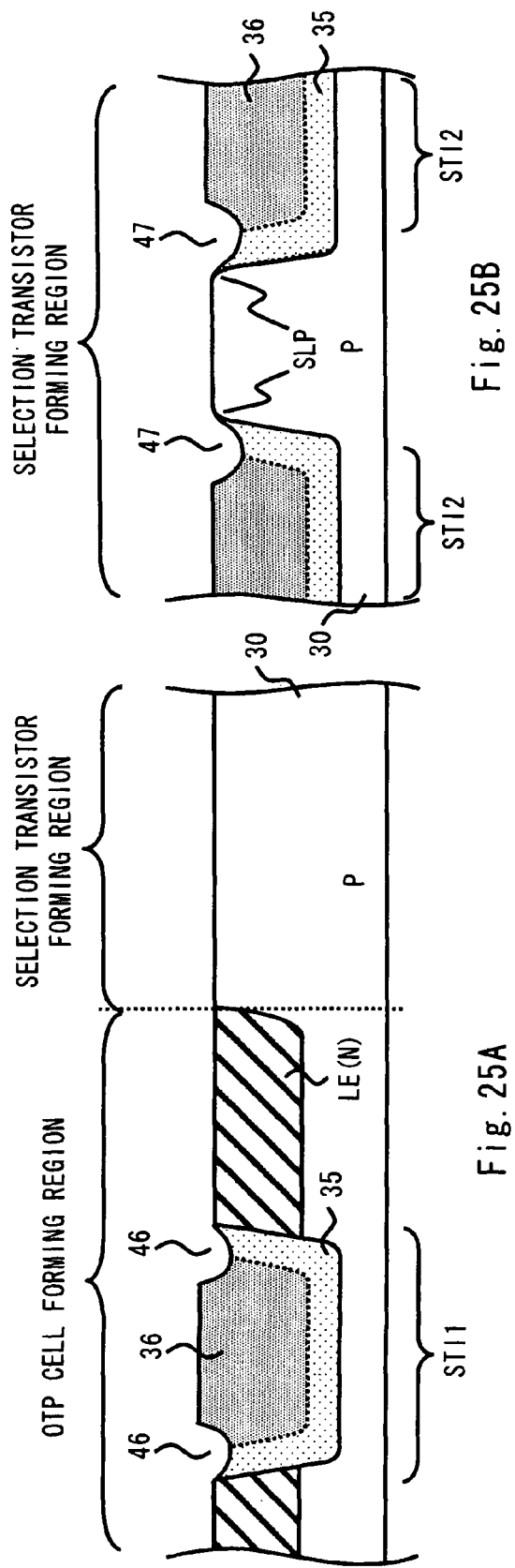

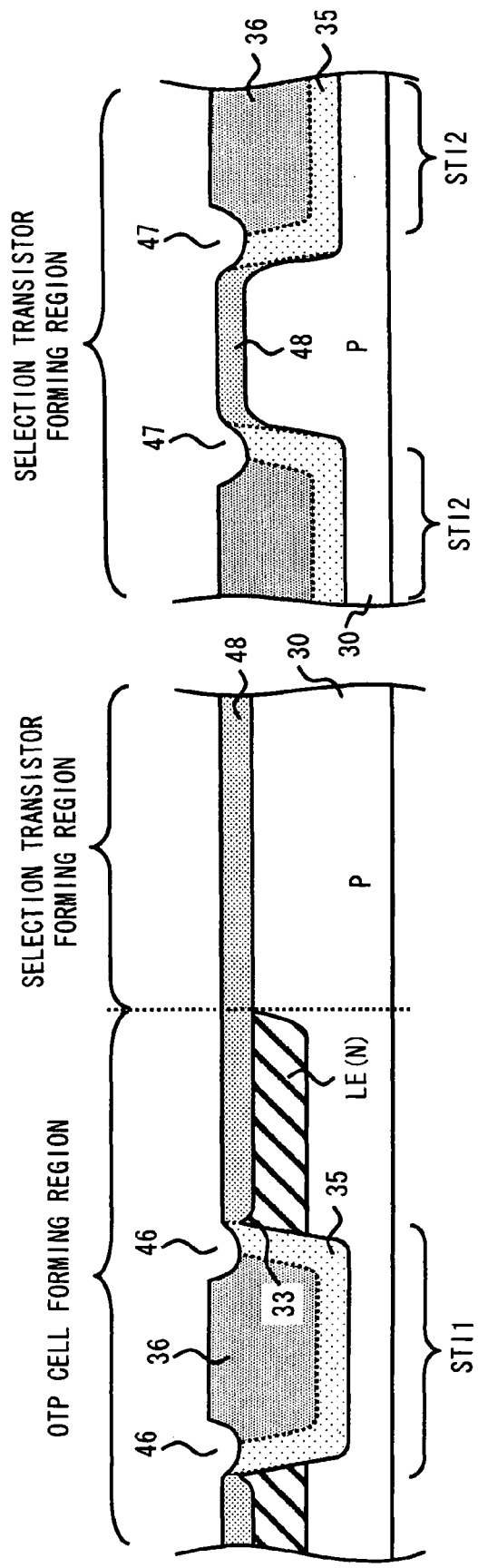

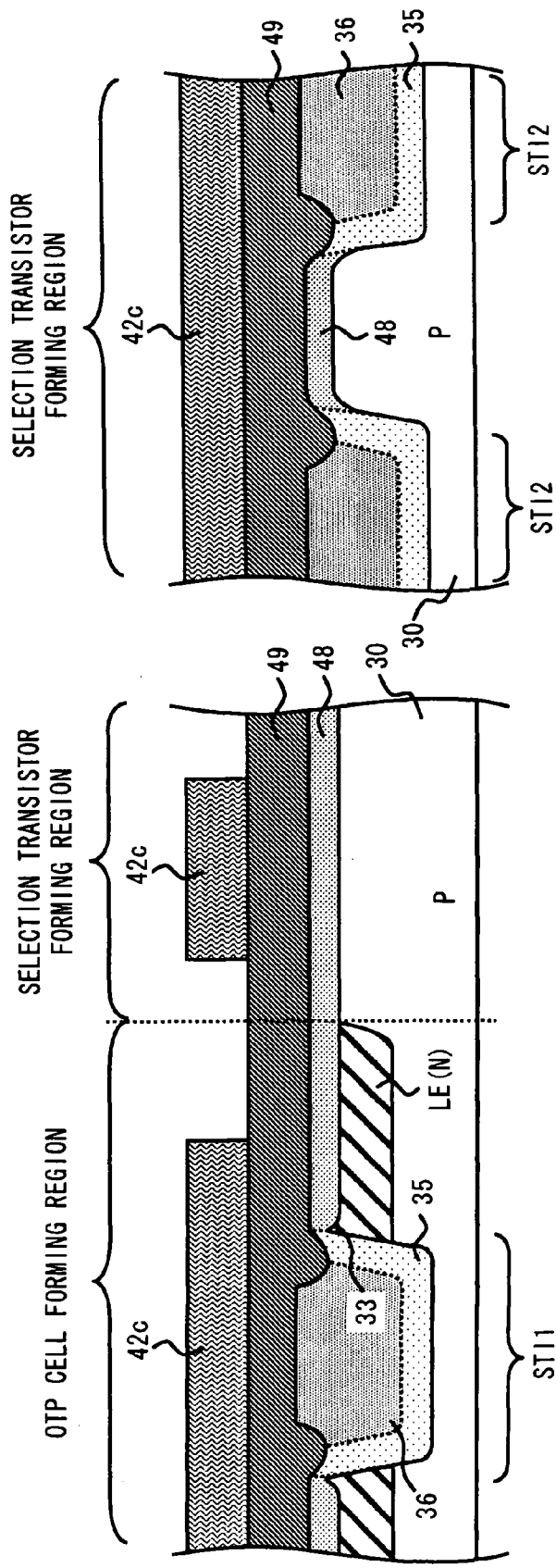

VOLTAGES AT TERMINALS OF OTP MEMORY CELL DURING WRITING OPERATION

| WORD LINE | BIT LINE | GATE VOLTAGE OF SELECTION TRANSISTOR | VOLTAGE AT UPPER ELECTRODE | SOURCE VOLTAGE | VOLTAGE APPLIED TO OTP MEMORY |
|---|---|---|---|---|---|
| SELECTED | SELECTED | Vg | Vbd | 0 | Vbd |
| SELECTED | NON-SELECTED | Vg | 0 | 0 | 0 |
| NON-SELECTED | SELECTED | 0 | Vbd | 0 | 0 |
| NON-SELECTED | NON-SELECTED | 0 | 0 | 0 | 0 |

Fig. 35

VOLTAGES AT TERMINALS OF OTP MEMORY CELL DURING READING OPERATION

| WORD LINE | BIT LINE | GATE VOLTAGE OF SELECTION TRANSISTOR | VOLTAGE AT UPPER ELECTRODE | SOURCE VOLTAGE |
|---|---|---|---|---|
| SELECTED | SELECTED | $V_g$ | $V_d$ | 0 |
| SELECTED | NON-SELECTED | $V_g$ | 0 | 0 |
| NON-SELECTED | SELECTED | 0 | $V_d$ | 0 |
| NON-SELECTED | NON-SELECTED | 0 | 0 | 0 |

Fig. 36

VOLTAGES AT TERMINALS OF OTP MEMORY CELL DURING WRITING OPERATION

| WORD LINE | BIT LINE | GATE VOLTAGE OF SELECTION TRANSISTOR | VOLTAGE AT UPPER ELECTRODE | SOURCE VOLTAGE | VOLTAGE APPLIED TO OTP MEMORY |
|---|---|---|---|---|---|
| SELECTED | SELECTED | -Vg | -Vbd | 0 | -Vbd |
| SELECTED | NON-SELECTED | -Vg | 0 | 0 | 0 |
| NON-SELECTED | SELECTED | 0 | -Vbd | 0 | About-Vbd/2 |
| NON-SELECTED | NON-SELECTED | 0 | 0 | 0 | 0 |

Fig. 40

VOLTAGES AT TERMINALS OF DESTRUCTIVE CELL DURING READING OPERATION

| WORD LINE | BIT LINE | GATE VOLTAGE OF SELECTION TRANSISTOR | VOLTAGE AT UPPER ELECTRODE | SOURCE VOLTAGE |
|---|---|---|---|---|
| SELECTED | SELECTED | $-V_g$ | $-V_d$ | 0 |
| SELECTED | NON-SELECTED | $-V_g$ | 0 | 0 |
| NON-SELECTED | SELECTED | 0 | $-V_d$ | 0 |
| NON-SELECTED | NON-SELECTED | 0 | 0 | 0 |

Fig. 41

VOLTAGES AT TERMINALS OF OTP MEMORY CELL DURING WRITING OPERATION

| WORD LINE | BIT LINE | GATE VOLTAGE OF SELECTION TRANSISTOR | VOLTAGE AT UPPER ELECTRODE | SOURCE VOLTAGE | VOLTAGE APPLIED TO OTP MEMORY |
|---|---|---|---|---|---|
| SELECTED | SELECTED | -Vg | -Vbd | 0 | -Vbd |
| SELECTED | NON-SELECTED | -Vg | 0 | 0 | 0 |
| NON-SELECTED | SELECTED | 0 | -Vbd | 0 | 0 |
| NON-SELECTED | NON-SELECTED | 0 | 0 | 0 | 0 |

Fig. 45

VOLTAGES AT TERMINALS OF DESTRUCTIVE CELL DURING READING OPERATION

| WORD LINE | BIT LINE | GATE VOLTAGE OF SELECTION TRANSISTOR | VOLTAGE AT UPPER ELECTRODE | SOURCE VOLTAGE |
|---|---|---|---|---|
| SELECTED | SELECTED | -Vg | -Vd | 0 |
| SELECTED | NON-SELECTED | -Vg | 0 | 0 |
| NON-SELECTED | SELECTED | 0 | -Vd | 0 |
| NON-SELECTED | NON-SELECTED | 0 | 0 | 0 |

Fig. 46

OTP MEMORY CELL, OTP MEMORY, AND METHOD OF MANUFACTURING OTP MEMORY CELL

BACKGROUND OF THE INVENTION

1. Field of the Invention

The present invention relates to a one time programmable (OTP) memory cell, an OTP memory, and a method of manufacturing an OTP memory cell. In particular, the present invention relates to an OTP memory cell having a nonvolatile state memory cell that is writable only once, an OTP memory, and a method of manufacturing an OTP memory cell.

2. Description of Related Art

As an example of a nonvolatile state memory cell formed in a semiconductor device, there is known a one time programmable cell (hereinafter, referred to as "OTP cell") that is writable only once. Japanese Patent Translation Publication No. 2005-504434 (hereinafter, referred to as "Related Art 1") discloses an example of a memory cell having the OTP cell. FIG. 47 shows a cross-sectional diagram of a memory cell 100 having the OTP cell as disclosed in Related Art 1.

The memory cell 100 includes an OTP cell and a selection transistor. FIG. 47 shows two memory cells. In a case of writing data in the memory cell, a voltage of about 2.5 V is first applied to a gate electrode (for example, row terminal Vr1) of the selection transistor, and then, a voltage of about 7.0 V is applied to a column terminal Vc1 of the OTP cell. As a result, the selection transistor is brought into a conducting state, and the voltage of 7.0 V is applied between a drain diffusion layer 107 and an electrode 102 of the OTP cell, whereby a breakdown occurs between the drain diffusion layer 107 and the electrode 102. Due to the breakdown, the drain diffusion layer 107 and the electrode 102 are short-circuited, with the result that data is written.

In such a writing operation, a voltage difference of about 7.0 V is generated between a gate r1 of the selection transistor and the drain diffusion layer 107. In Related Art 1, in order to prevent a breakdown of the selection transistor due to the voltage difference between the gate r1 and the drain diffusion layer 107, a gate insulating film 108 of the selection transistor is formed with a thickness greater than that of the gate insulating film 108 of the OTP cell.

However, in Related Art 1, the voltage high enough to cause the breakdown in the OTP cell is applied. Accordingly, it is necessary to additionally provide a booster circuit incorporating a high withstand voltage element. Alternatively, it is necessary to additionally provide a power supply capable of generating a voltage higher than a power supply voltage which is applied to a control circuit or the like for the writing operation. Also for peripheral circuits of the memory cell, it is necessary to use a transistor capable of withstanding a voltage higher than the power supply voltage. In general, a high withstand voltage element has an element area larger than that of an element constituting a logic circuit such as a control circuit. Accordingly, when a circuit incorporating such a high withstand voltage element is additionally provided, there arises a problem of an increase in chip area.

SUMMARY

In one embodiment of the present invention, there is provided an OTP memory cell including a state memory cell and a selection transistor, including: a semiconductor substrate including: a lower electrode forming region having a lower electrode of the state memory cell formed therein; a diffusion layer forming region having a source and a drain of the selection transistor formed therein; a first trench-type insulating region adjacent to the lower electrode forming region; and a second trench-type insulating region adjacent to the diffusion layer forming region; a first insulating film (which corresponds to first insulating film 31 of embodiment) being in contact with the first trench-type insulating region and formed on the lower electrode; an upper electrode of the state memory cell formed on the first insulating film; a channel region extending between the source and the drain; a second insulating film (which corresponds to second insulating film 32 of embodiment) being in contact with the second trench-type insulating region and formed on the channel region; and a gate electrode of the selection transistor formed on the second insulating film. In the OTP memory cell, a shape of at least a part of an end of the lower electrode forming region in contact with the first insulating film is sharper than a shape of an end of the channel region in contact with the second insulating film.

Further, in another embodiment of the present invention, there is provided A one time programmable (OTP) memory cell including a state memory cell and a selection transistor, including: a semiconductor substrate including: a lower electrode forming region having a lower electrode of the state memory cell formed therein; a diffusion layer forming region having a source and a drain of the selection transistor formed therein; a first trench-type insulating region adjacent to the lower electrode forming region; and a second trench-type insulating region adjacent to the diffusion layer forming region; a first insulating film being in contact with the first trench-type insulating region and formed on the lower electrode; an upper electrode of the state memory cell formed on the first insulating film; a channel region extending between the source and the drain; a second insulating film being in contact with the second trench-type insulating region and formed on the channel region; and a gate electrode of the selection transistor formed on the second insulating film, wherein a thickness of a portion of the first insulating film, which is formed on an end of the lower electrode, is smaller than a thickness of other portions of the first insulating film.

With the OTP memory cell according to the present invention, the shape of at least a part of the end of the lower electrode forming region in contact with the first insulating film is sharper than the shape of the end of the channel region in contact with the second insulating film. Accordingly, during destructive write of the state memory cell, an electric field having a strength greater than that of an electric field generated in the channel region of the selection transistor is generated at a sharp portion formed at the end of the lower electrode. As a result, a withstand voltage of the state memory cell becomes lower than a breakdown withstand voltage of the selection transistor at the sharp portion.

Further, an OTP memory according to the present invention includes the above-described OTP memory cells. In other words, it is possible to set the breakdown withstand voltage of the state memory unit to be lower than that of a conventional state memory cell. Accordingly, there is no need to generate a voltage higher than that of a peripheral circuit of the memory cell, and there arises no problem if the withstand voltage of an element constituting the peripheral circuit is lowered.

With the OTP memory cell, the OTP memory, and the method of manufacturing an OTP memory cell according to the present invention, it is possible to set the breakdown withstand voltage of the OTP cell to be lower than that of the conventional OTP cell. As a result, the breakdown withstand voltage of each of the selection transistor and a transistor constituting a peripheral circuit can be set to be lower than that of the conventional case. Accordingly, with the OTP memory cell, the OTP memory, and the method of manufacturing an OTP memory cell according to the present invention, the selection transistor and the peripheral circuit can be formed using a transistor having a small transistor size and a low breakdown withstand voltage, whereby the reduction in circuit area can be achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 is a table showing voltages to be applied to terminals during a writing operation in the OTP memory cell according to the first embodiment;

FIG. 9 is a table showing voltages to be applied to terminals during a reading operation in the OTP memory cell according to the first embodiment;

FIGS. 11A and 11B are cross-sectional diagrams each showing a second step of manufacturing the OTP memory cell according to the first embodiment;

FIGS. 13A and 13B are cross-sectional diagrams each showing a fourth step of manufacturing the OTP memory cell according to the first embodiment;

FIGS. 16A and 16B are cross-sectional diagrams each showing a seventh step of manufacturing the OTP memory cell according to the first embodiment;

FIGS. 18A and 18B are cross-sectional diagrams each showing a ninth step of manufacturing the OTP memory cell according to the first embodiment;

FIGS. 20A and 20B are cross-sectional diagrams each showing an eleventh step of manufacturing the OTP memory cell according to the first embodiment;

FIGS. 21A and 21B are cross-sectional diagrams each showing a twelfth step of manufacturing the OTP memory cell according to the first embodiment;

FIGS. 23A and 23B are cross-sectional diagrams each showing a fourteenth step of manufacturing the OTP memory cell according to the first embodiment;

FIGS. 25A and 25B are cross-sectional diagrams each showing a sixteenth step of manufacturing the OTP memory cell according to the first embodiment;

FIGS. 26A and 26B are cross-sectional diagrams each showing a seventeenth step of manufacturing the OTP memory cell according to the first embodiment;

FIGS. 27A and 27B are cross-sectional diagrams each showing an eighteenth step of manufacturing the OTP memory cell according to the first embodiment;

FIG. 35 is a table showing voltages to be applied to terminals during a writing operation in the OTP memory cell according to the third embodiment;

FIG. 36 is a table showing voltages to be applied to terminals during a reading operation in the OTP memory cell according to the third embodiment;

FIG. 40 is a table showing voltages to be applied to terminals during a writing operation in the OTP memory cell according to the fourth embodiment;

FIG. 41 is a table showing voltages to be applied to terminals during a reading operation in the OTP memory cell according to the fourth embodiment;

FIG. 45 is a table showing voltages to be applied to terminals during a writing operation in the OTP memory cell according to the fifth embodiment;

FIG. 46 is a table showing voltages to be applied to terminals during a reading operation in the OTP memory cell according to the fifth embodiment.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
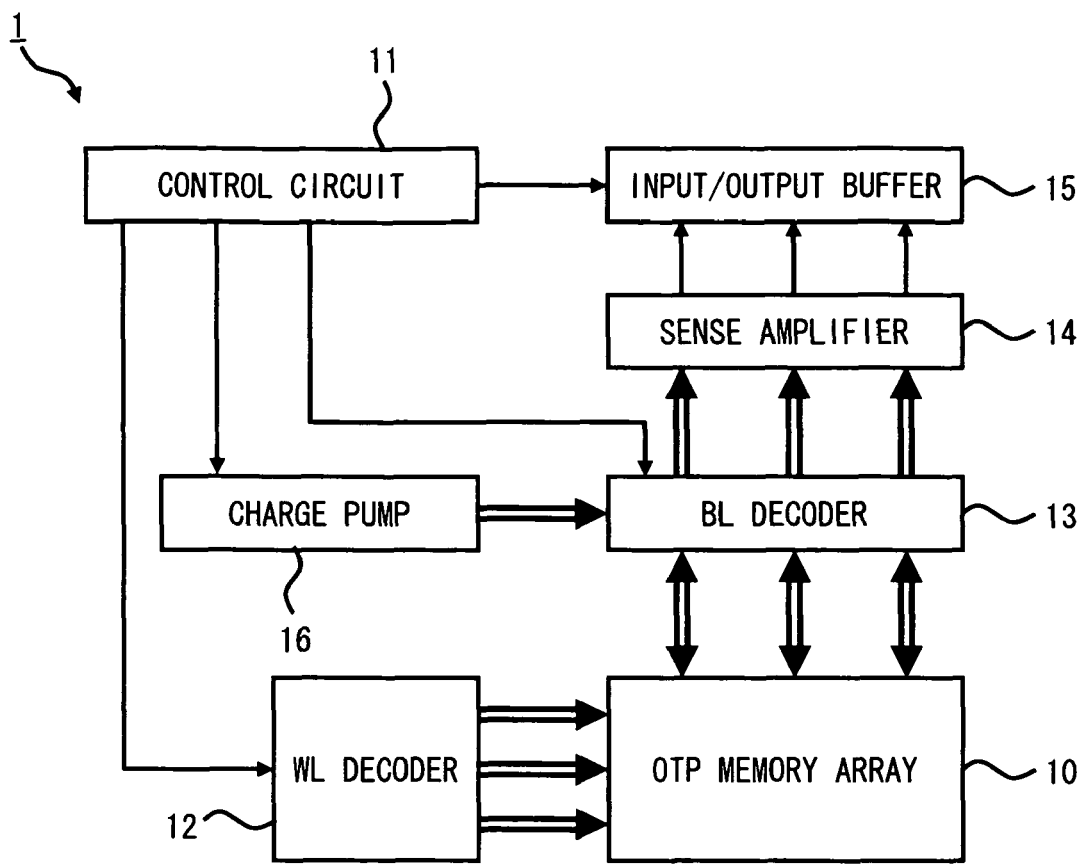
FIG. 1 is a block diagram showing an OTP memory according to a first embodiment of the present invention.

Hereinafter, embodiments of the present invention will be described with reference to the drawings. In the following description, as an example of a semiconductor device according to the present invention, a description is given of an OTP memory incorporating an OTP memory cell as a state memory cell. FIG. 1 is a block diagram showing a semiconductor device 1 according to a first embodiment of the present invention. As shown in FIG. 1, the semiconductor device 1 includes an OTP memory array 10, a control circuit 11, a WL decoder 12, a BL decoder 13, a sense amplifier 14, an input/output buffer 15, and a charge pump 16.

The OTP memory array 10 includes a plurality of OTP memory cells each having a state memory cell. In the OTP memory array 10, the plurality of OTP memory cells are arranged in a lattice manner. The OTP memory array 10 will be described in detail later. The control circuit 11 controls each block incorporated in the semiconductor device 1 in response to a control signal input from the outside. The WL decoder 12 decodes a word line address sent from the control circuit 11. Then, a word line specified based on the decoding results is driven. The BL decoder 13 decodes a bit line address sent from the control circuit 11. Then, a bit line specified based on the decoding results is selected, and a voltage is output to the selected bit line during a writing operation or a reading operation. The sense amplifier 14 detects a value of a current flowing through a memory cell selected via the BL decoder 13, and outputs a voltage to the input/output buffer 15 according to the detected current value. The input/output buffer 15 is an interface between the semiconductor device 1 and another device. The charge pump 16 is an example of a booster circuit, which generates a voltage higher than a power supply voltage. The voltage generated by the charge pump 16 is supplied to the BL decoder 13 during the writing operation. Then, the BL decoder 13 writes data to the OTP memory array 10 by using the high voltage.

Figure 2:
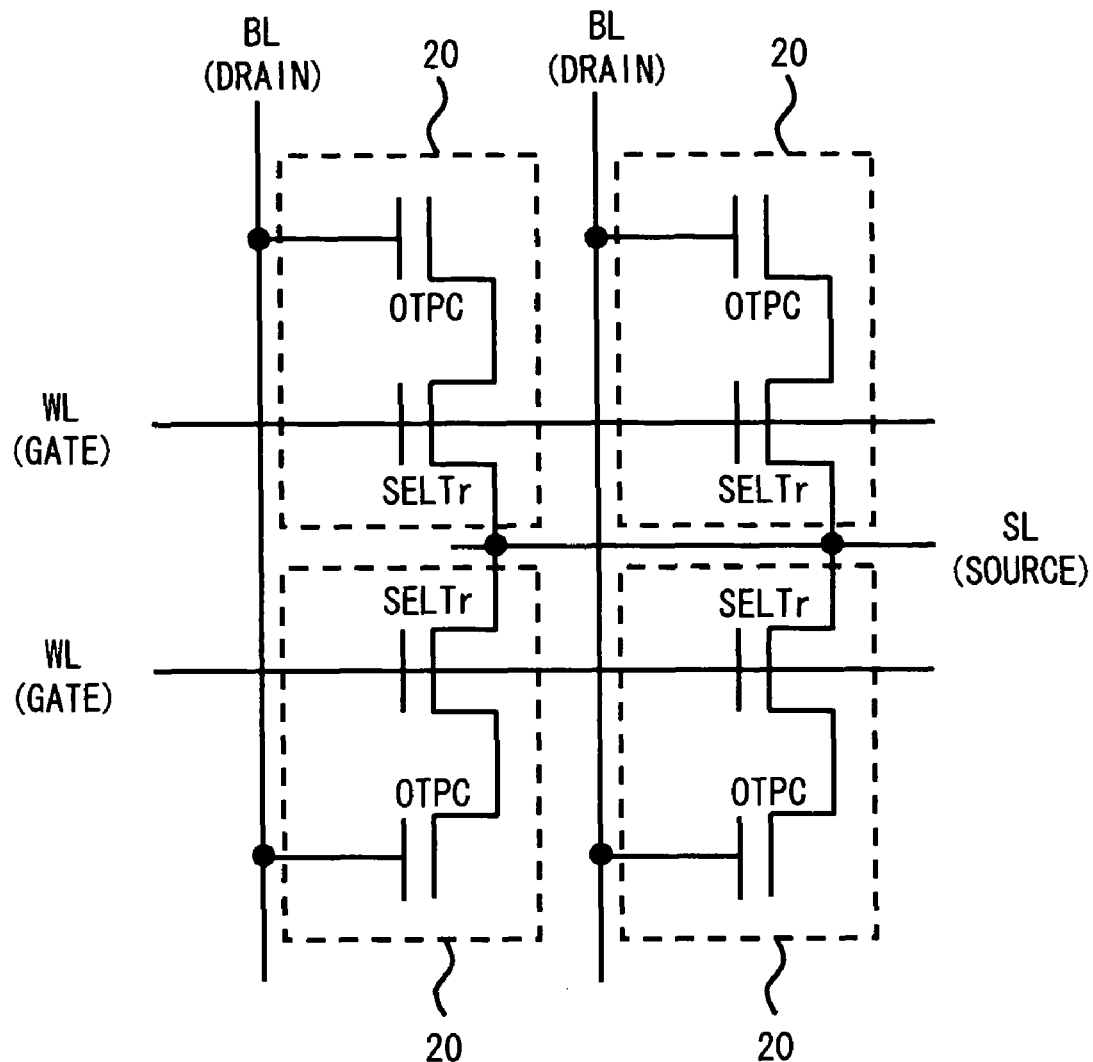
FIG. 2 is a circuit diagram showing OTP memory cells according to the first embodiment.

In this case, the OTP memory array 10 will be described in detail. FIG. 2 shows a circuit diagram of four OTP memory cells 20 among the plurality of OTP memory cells arranged in the OTP memory array 10. As shown in FIG. 2, the OTP memory cells 20 each include a selection transistor SELTr and a state memory cell (for example, OTP cell represented as OTPC in FIG. 2). In the first embodiment, an NMOS transistor is used as the selection transistor SELTr. A source of the selection transistor SELTr is connected to a source line SL and a drain of the transistor SELTr is connected to a lower electrode of the OTP cell. A gate electrode of the selection transistor SELTr is connected to a word line WL. An upper electrode of the OTP cell is connected to a bit line BL.

The selection transistor SELTr controls a conducting state between the source and the drain based on a voltage value of the word line WL. In the case of using the NMOS transistor as the selection transistor SELTr, when a high level (for example, power supply potential VDD) is supplied to the word line WL, the source and the drain are brought into a conducting state, and when a low level (ground potential VSS) is supplied to the word line WL, the source and the drain are brought into a non-conducting state. Note that the source line SL is supplied with the ground potential VSS.

The OTP cell has a configuration in which the upper electrode and the lower electrode are stacked with an insulator interposed therebetween. When a potential difference between the upper electrode and the lower electrode reaches a predetermined value, the upper electrode and the lower electrode are short-circuited, with the result that the OTP cell stores data "1", for example. On the other hand, when the upper electrode and the lower electrode are not short-circuited, a value stored in the OTP cell indicates data "0". When the data "1" is stored in the OTP cell, the sense amplifier 14 detects a current flowing between the upper electrode and the lower electrode. On the other hand, when the data "0" is stored in the OTP cell, a current does not flow from the upper electrode to the lower electrode. Accordingly, the sense amplifier 14 detects no current, with the result that the data "0" is read.

Figure 3:
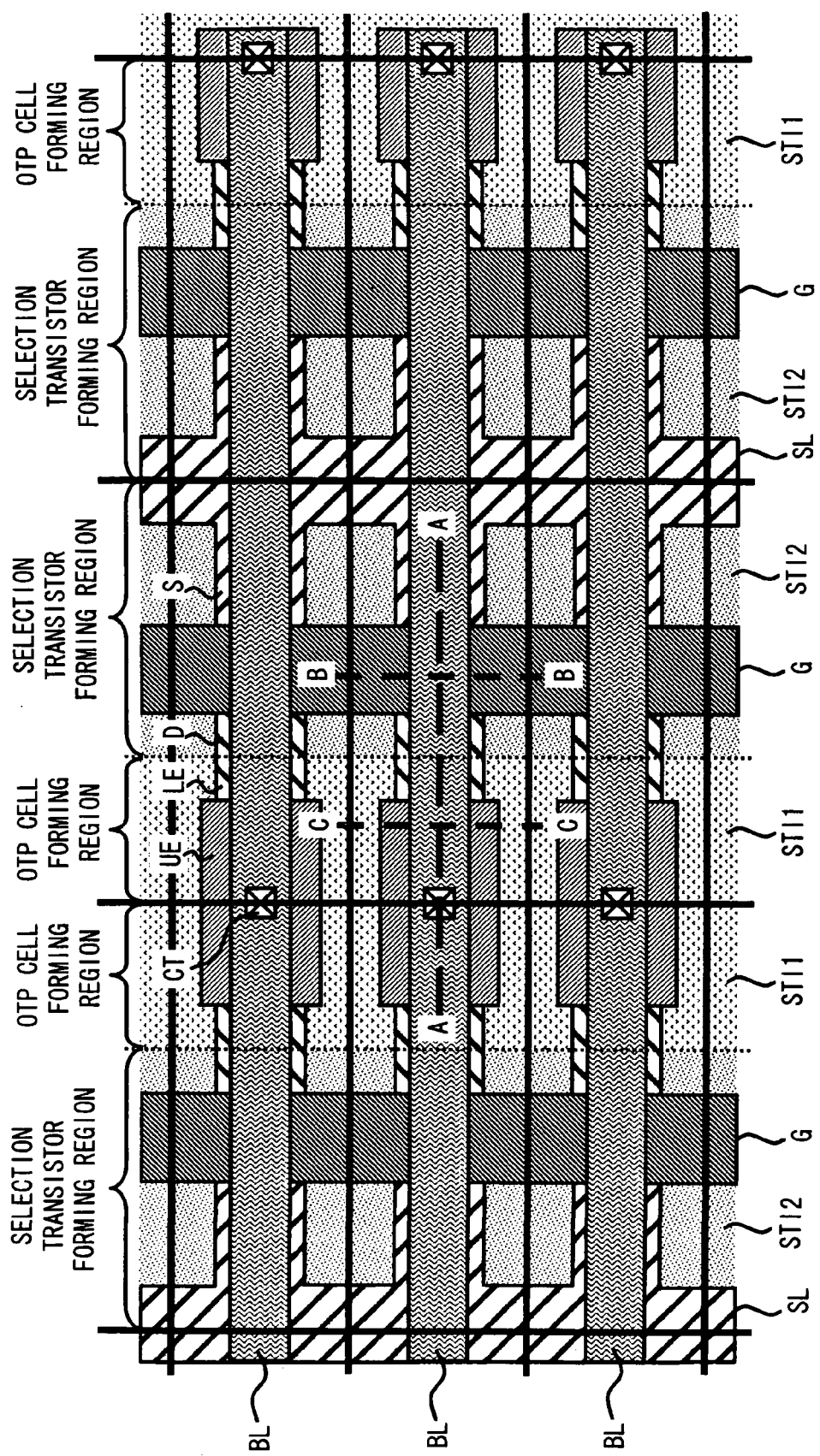
FIG. 3 is a diagram showing a planar layout of the OTP memory cells according to the first embodiment.

Next, a planar layout of the OTP memory array 10 will be described. FIG. 3 shows the planar layout of the OTP memory array 10. FIG. 3 illustrates nine OTP memory cells 20 among the plurality of OTP memory cells. As shown in FIG. 3, the OTP memory array 10 includes selection transistor forming regions and state memory cell forming regions (for example, OTP cell forming regions). The OTP memory cells 20 each include a pair of the selection transistor forming region and the OTP cell forming region. An OTP cell is formed in the OTP cell forming region, and a selection transistor is formed in the selection transistor forming region. The OTP memory cells, which are adjacent to each other in a horizontal direction of FIG. 3, are formed so that the same regions are in contact with each other. The OTP memory cells, which are adjacent to each other in a vertical direction of FIG. 3, are formed so that the same regions are arranged in the vertical direction. When the selection transistor forming regions and the OTP cell forming regions are arranged in this manner, in the adjacent OTP memory cells, for example, the upper electrode of the OTP cell can be commonly formed for each of two OTP memory cells. Further, in the adjacent OTP memory cells, a source S of the selection transistor can be commonly formed for each of two adjacent OTP memory cells. Note that, in the first embodiment, a diffusion layer forming the source S of the selection transistor, and the source line SL are integrally formed.

As shown in FIG. 3, in the OTP memory cells 20, a diffusion layer forming a lower electrode LE, and a diffusion layer forming a drain D of the selection transistor SELTr are integrally formed when viewed from above. In other words, the lower electrode LE and the drain D of the selection transistor are connected to each other by the diffusion layer.

An upper electrode UE of the OTP cell is connected to the bit line BL which is formed on the upper electrode UE via a contact CT. The bit line BL is commonly formed for each of the OTP memory cells 20 arranged in a row direction (horizontal direction of FIG. 3) among the OTP memory cells 20 arranged in a lattice manner. Note that the lower electrode LE of each OTP memory cell 20 has a projection along an outer periphery of the diffusion layer which is in contact with an isolation region, but the projection is omitted in FIG. 3. The projection will be described later.

The gate electrode of the selection transistor is commonly formed for each of the OTP memory cells 20 arranged in a column direction (vertical direction of FIG. 3) among the OTP memory cells 20 arranged in a lattice manner. The source S of the selection transistor is commonly formed for each of the selection transistors of the OTP memory cells 20 arranged in the column direction among the OTP memory cells 20 arranged in a lattice manner. In two OTP memory cells 20 with the selection transistor forming regions adjacent to each other, the source is commonly formed for each of the selection transistors formed in the adjacent selection transistor forming regions.

Further, in a region in which the lower electrode LE is not formed in the OTP cell forming region, a first trench-type insulating region STI1 is formed. In a region in which the source S and the drain D of the selection transistor are not formed in the selection transistor forming region, a second trench-type insulating region STI2 is formed.

Figure 4:
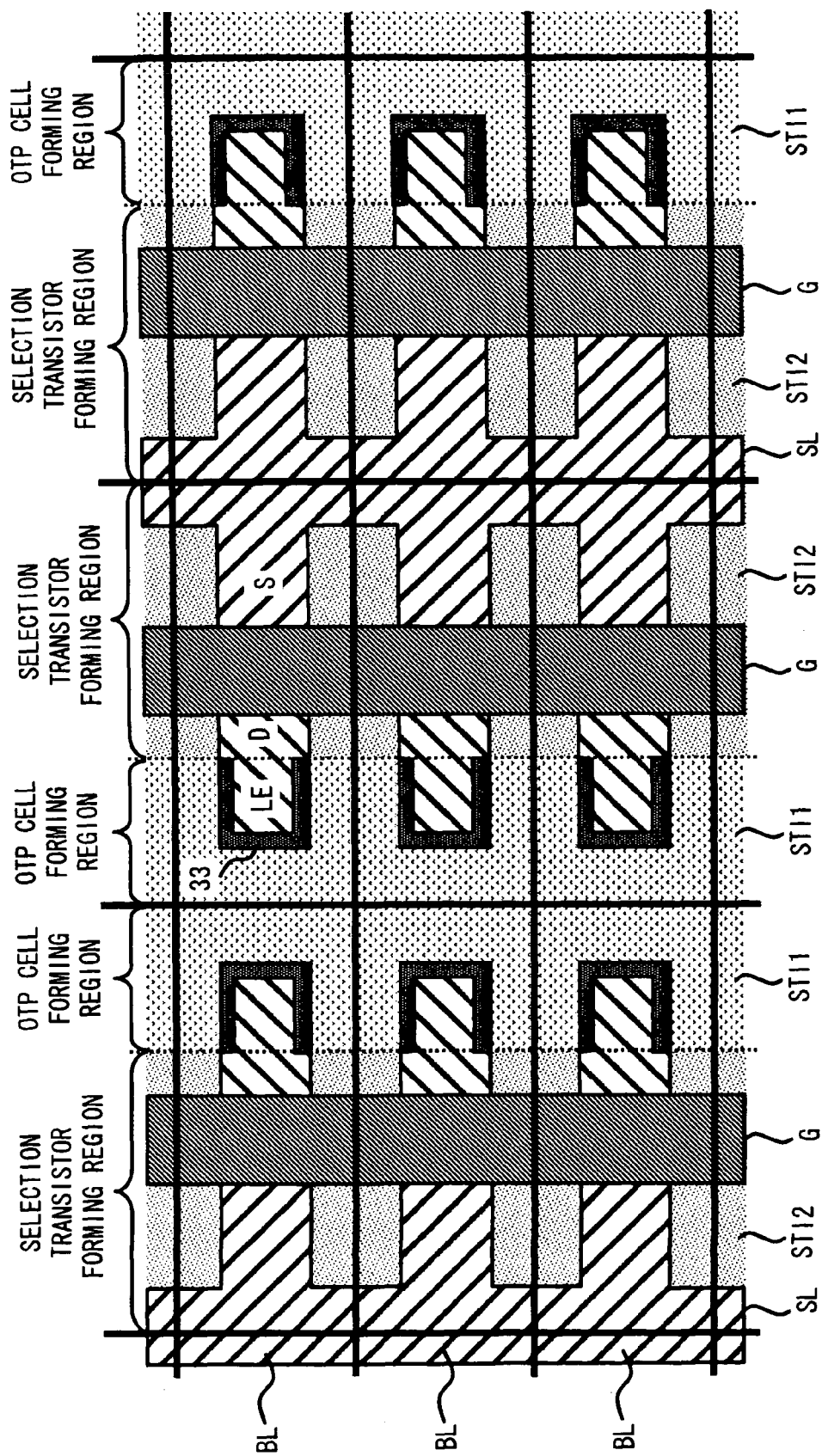
FIG. 4 is a diagram showing a planar layout of the OTP memory cells shown in FIG. 3, in which bit lines and upper electrodes are omitted.

FIG. 4 shows a planar layout of the OTP memory cells shown in FIG. 3, in which the bit lines BL, the contacts CT, and the upper electrodes UE are omitted. As shown in FIG. 4, the lower electrodes LE of the OTP memory cells 20 of the first embodiment each have a sharp portion 33 along an outer periphery of a lower electrode forming region which is in contact with the first trench-type insulating region STI1. Note that, in the first embodiment, the lower electrode is formed in the entire lower electrode forming region, but the lower electrode may be formed in a part of the lower electrode forming region.

Figure 5A:
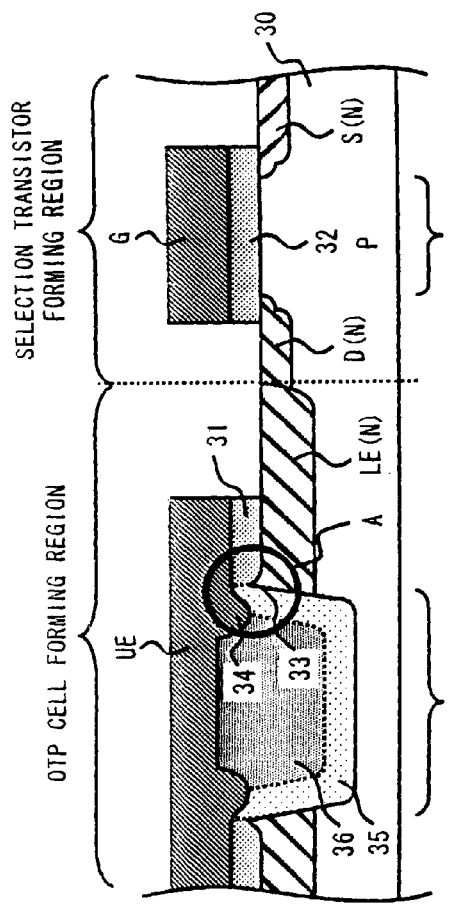
FIGS. 5A to 5C are cross-sectional diagrams each showing the OTP memory cell according to the first embodiment.
Figure 5C:
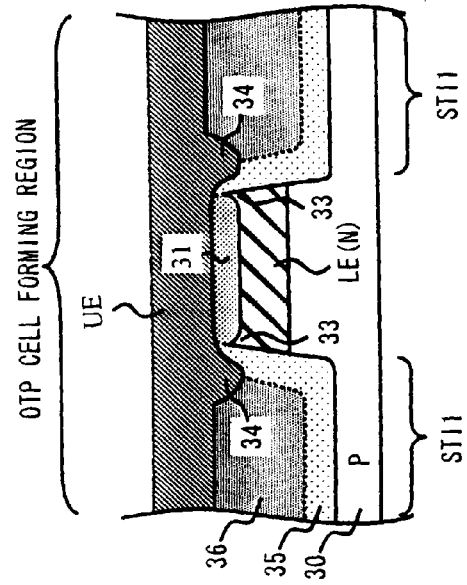
Figure 5B:
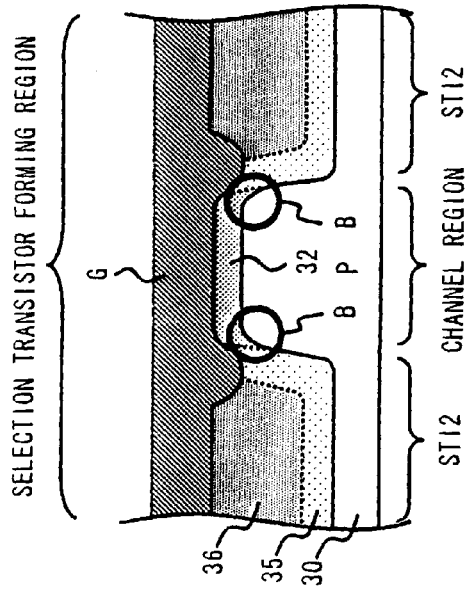

FIGS. 5A to 5C are cross-sectional diagrams each showing the OTP memory cell 20 including the sharp portion 33. A description is given of the configuration of the OTP memory cell 20. The cross-sectional diagram of FIG. 5A shows a cross section of the OTP memory cell 20 taken along the line A-A of FIG. 3. FIG. 5B shows a cross-sectional diagram of the selection transistor of the OTP memory cell 20 taken along the line B-B of FIG. 3. FIG. 5C shows a cross-sectional diagram of the OTP memory cell 20 taken along the line C-C of FIG. 3. Note that, in FIGS. 5A to 5C, reference symbols P and N each denote a polarity of a semiconductor forming the region. In the cross-sectional diagrams to be referred to hereinafter, including FIGS. 5A to 5C, the contacts CT and the bit lines BL are omitted.

As shown in FIG. 5A, the lower electrode LE of the OTP cell is in contact with the lower electrode LE of the OTP cell of the adjacent OTP memory cell 20 with the first trench-type insulating region STI1 interposed therebetween. In a top surface of the lower electrode LE, the lower electrode LE has the sharp portion 33 which is an end of the lower electrode LE formed on a side being in contact with the first trench-type insulating region STI1. As shown in FIG. 4, the sharp portion 33 is formed along the outer periphery of the lower electrode LE. The upper electrode UE of the OTP cell is commonly formed for each of two adjacent memory cells 20. In other words, the upper electrode UE is formed so as to cover at least a part of two lower electrodes LE of the adjacent OTP memory cells and an upper portion of the first trench-type insulating region STI1 formed between the two lower electrodes LE. The upper electrode UE has projections 34 each projecting to a side of the first trench-type insulating region STI1 in the upper portion of the trench-type insulating region STI1. The projections 34 are each formed via the sharp portion 33 and a first insulating film 31. Moreover, between the upper electrode UE and the lower electrode LE, the first insulating film 31 is formed. Specifically, a thickness of the first insulating film 31 formed between the upper electrode UE and the lower electrode LE is smallest at a tip end of the sharp portion 33. Accordingly, a distance between the upper electrode UE and the lower electrode LE is shortest at the tip end of the sharp portion 33. Note that the lower electrode LE is made of an N-type semiconductor on a substrate 30 made of a P-type semiconductor.

In the selection transistor, a gate electrode G is formed above the substrate 30, which is made of the P-type semiconductor, with a second insulating film 32 interposed therebetween. The drain D of the selection transistor is made of a semiconductor having the same conductivity type (N-type semiconductor in this embodiment) as that of the lower electrode LE. The drain D is formed in a region including a portion which is in contact with the lower electrode LE and a portion which is formed under the gate electrode G. The source S of the selection transistor is made of a semiconductor having the same conductivity type (N-type semiconductor in this embodiment) as that of the drain D. The source S is formed in a region including a portion which is formed under the gate electrode G. A region which is formed between the source S and the drain D and which corresponds to a lower portion of the second insulating film 32 is referred to as a channel region.

Next, a description is given of the cross-sectional diagram of the selection transistor shown in FIG. 5B. FIG. 5B is a cross-sectional diagram of the selection transistor viewed from a direction orthogonal to a channel direction extending from the source S to the drain D. As shown in FIG. 5B, the channel region of the selection transistor is formed so as to be adjacent to the second trench-type insulating regions STI2. The channel region is formed such that a portion of the substrate 30 projects farther than the other portion thereof. The gate electrode G is formed above the channel region with the second insulating film 32 interposed therebetween. The channel region has curved surfaces (regions B of FIG. 5B) formed at ends of the channel region on the top surface side thereof. The gate electrode G has projections which correspond to upper portions of the second trench-type insulating regions STI2 in contact with the channel region, and which are formed via the channel region and the insulating region. A thickness of the second insulating film 32 formed between the projections and the ends of the channel region is substantially the same as that of the second insulating film 32 formed between a top surface of the channel region and a bottom surface of the gate electrode G. A thickness of the second insulating film 32 formed between the top surface of the channel region in the vicinity of the center thereof and the bottom surface of the gate electrode G is substantially the same as that of the first insulating film 31 formed between the lower electrode LE of the OTP cell in the vicinity of the center of a portion on which the upper electrode UE is formed, and a facing bottom surface of the upper electrode UE.

Next, a description is given of the cross-sectional diagram of the OTP cell shown in FIG. 5C. FIG. 5C is a cross-sectional diagram of the OTP cell viewed from the direction orthogonal to a direction of a current flow through the lower electrode LE. As shown in FIG. 5C, the lower electrode LE is formed on the substrate 30. At both ends on the top surface side of the lower electrode LE, the sharp portions 33 are formed. The upper electrode UE formed in an upper portion of the first trench-type insulating regions STI1 that are formed so as to be adjacent to both sides of the lower electrode LE has the projections 34 projecting to the side of the first trench-type insulating regions STI1. The projections 34 are formed via the sharp portions 33 and the insulating film 31. Note that a thickness of the insulating film 31 formed between a planar portion of the top surface of the lower electrode LE and the upper electrode UE is substantially the same as that of the second insulating film 32 formed between the top surface of the channel region of the selection transistor and the bottom surface of the gate electrode G. Also in FIG. 5C, the thickness of the first insulating film 31 formed between the upper electrode UE and the lower electrode LE is smallest in the vicinity of the sharp portion 33. Accordingly, the distance between the upper electrode UE and the lower electrode LE is shortest in the vicinity of the sharp portion 33. Further, a top surface of the lower electrode forming region, in which the lower electrode LE is formed, is formed into a concave shape.

Note that, in FIGS. 5A to 5C, the first trench-type insulating region STI1 and the second trench-type insulating region STI2 each include a thermal reaction insulating film 35 and a plasma reaction insulating film 36. Though the two insulating films are different in that the thermal reaction insulating film is formed by thermal reaction and the plasma reaction film is formed by plasma reaction, the two insulating films have substantially the same functions. The first trench-type insulating region STI1 and the second trench-type insulating region STI2 are denoted by different reference symbols because the regions are formed in different regions, but the regions have substantially the same functions. In the following description, a region including the lower electrode forming region having the lower electrode LE formed therein, a diffusion layer forming region having the source S and the drain D of the selection transistor formed therein, the first trench-type insulating region STI1, and the second trench-type insulating region STI2 is referred to as a semiconductor substrate.

Figure 6:
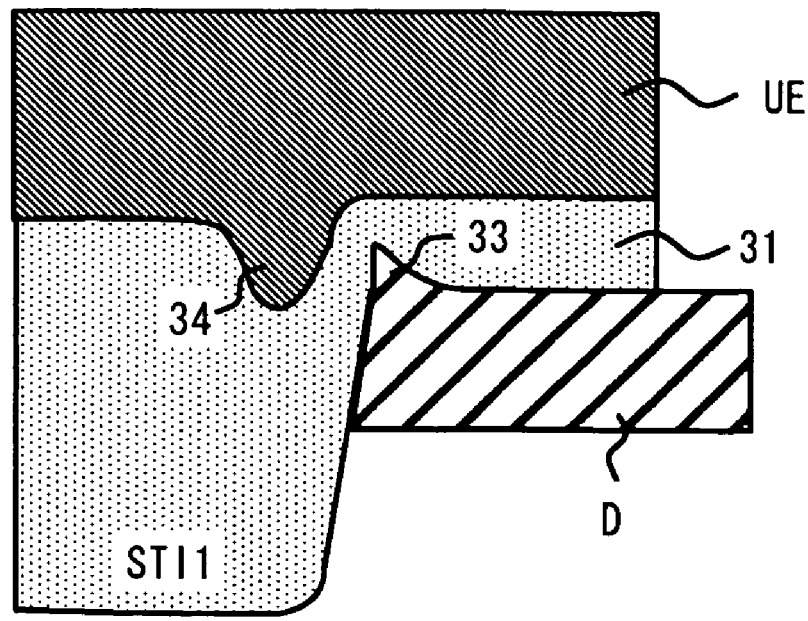
FIG. 6 is an enlarged view of a region "A" shown in the cross-sectional diagram of FIG. 5A in a case of storing data "0"
Figure 7:
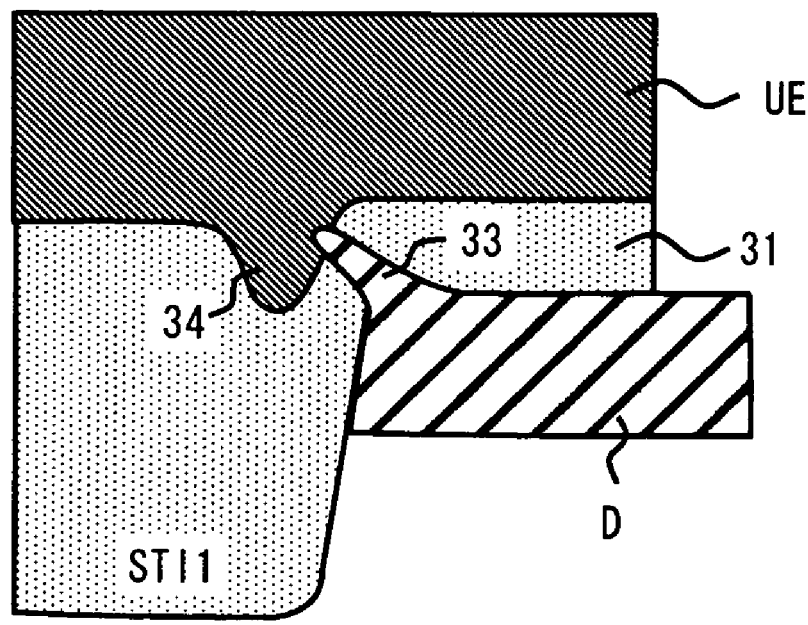
FIG. 7 is an enlarged view of the region "A" shown in the cross-sectional diagram of FIG. 5A in a case of storing data "1"

In this case, FIGS. 6 and 7 each show an enlarged view of a region "A" shown in FIG. 5A, and a description is given of a storage state of data in the OTP memory. Note that, in FIGS. 6 and 7, the thermal reaction insulating film 35 and the plasma reaction insulating film 36 are not distinguished from each other but are simply illustrated as the first trench-type insulating region STI1. FIG. 6 shows a state in which data "0" is stored in the OTP memory. FIG. 7 shows a state in which data "1" is stored in the OTP memory. As shown in FIG. 6, in the state in which the data "0" is stored, the lower electrode LE and the upper electrode UE are insulated from each other via the first insulating film 31. On the other hand, as shown in FIG. 7, in the state in which the data "1" is stored, the sharp portion 33 of the lower electrode LE is in contact with the upper electrode UE, whereby the lower electrode LE and the upper electrode UE are short-circuited. The short-circuit state is caused in such a manner that a voltage difference is produced between the upper electrode UE and the lower electrode LE to make the two electrodes break down. Note that, in an initial state, the OTP cell is in the state of storing the data "0", and makes the two electrodes break down only in the state of storing the data "1".

Such a writing operation will be described with reference to a table shown in FIG. 8. The table of FIG. 8 shows voltages to be applied to terminals of the OTP memory cells 20 in the case of writing data. First, in the case of writing the data "1", the word line WL and the bit line BL are each set to a selected state. In this case, a voltage (gate voltage) to be applied to the gate electrode G of the selection transistor becomes a voltage Vg supplied through the word line WL. As a result, the selection transistor is brought into the conducting state, and a first voltage (for example, ground potential VSS) applied to the source S is applied to the lower electrode LE of the OTP cell. Further, to the upper electrode UE of the OTP cell, a high voltage (voltage having a voltage value larger than that of first voltage, which is, for example, voltage Vbd) generated by the charge pump 16 is supplied through the bit line BL. As a result, the voltage difference between the upper electrode UE and the lower electrode LE of the OTP cell becomes a voltage Vbd. In this case, an electric field is concentrated on the sharp portions 33, whereby a breakdown withstand voltage thereof becomes lower than that of the portion other than the projections. Then, a breakdown occurs between the sharp portion 33 and the upper electrode UE, and the lower electrode LE and the upper electrode UE are short-circuited, with the result that the data "1" is written. The voltage Vbd is large enough to make the sharp portion 33 and the upper electrode UE of the OTP cell break down, and the voltage Vbd is much lower than a withstand voltage of the second insulating film 32 of the selection transistor.

On the other hand, when the word line WL is set to the selected state and the bit line BL is set to a non-selected state, a gate voltage applied to the gate electrode G of the selection transistor becomes the voltage Vg supplied through the word line WL. As a result, the selection transistor SELTr is brought into the conducting state, and the ground potential VSS applied to a source diffusion layer is applied to the lower electrode LE of the OTP memory. Since the bit line BL is in the non-selected state, the ground potential VSS is applied to the upper electrode UE of the OTP memory. As a result, the voltage difference between the upper electrode UE and the lower electrode LE of the OTP cell becomes 0 V. Accordingly, the breakdown does not occur between the upper electrode UE and the lower electrode LE, and the upper electrode UE and the lower electrode LE are kept insulated from each other, whereby the state in which the data "0" is stored is maintained.

When the word line WL is set to the non-selected state, the selection transistor is brought into the non-conducting state. In this case, when the bit line BL is in the selected state, the voltage Vbd is applied to the upper electrode UE of the OTP cell, but the ground potential VSS is not applied to the lower electrode LE. Accordingly, the potential difference between the upper electrode UE and the lower electrode LE becomes about a voltage Vbd/2. When the potential difference between the upper electrode UE and the lower electrode LE is about the voltage Vbd/2, the breakdown does not occur between the upper electrode UE and the lower electrode LE. When the word line WL and the bit line BL are in the non-selected state, the voltage difference between the upper electrode UE and the lower electrode LE becomes 0 V, and the breakdown does not occur between the upper electrode UE and the lower electrode LE. In other words, when the word line WL is in the non-selected state, the memory cell is not selected, with the result that the state in which the data "0" is stored is maintained.

Next, a description is given of an operation of reading data from the OTP cell. FIG. 9 is a table showing voltages to be applied to the terminals of the OTP memory cell 20 in the case of reading data from the OTP memory. First, in the case of reading the data "1", the word line WL and the bit line BL are set to the selected state. In this case, the gate voltage applied to the gate electrode G of the selection transistor SELTr becomes the voltage Vg supplied through the word line WL. As a result, the selection transistor is brought into the conducting state, which causes a current to flow between the drain D and the source S. Further, to the upper electrode UE of the OTP cell, the voltage Vd is supplied through the bit line BL. Then, in the OTP memory to which the data "1" is written, the current flows from the upper electrode UE to the source diffusion layer via the lower electrode LE. The current is detected by the sense amplifier 14, whereby the data "1" is read. In this case, the voltage Vd is smaller than the voltage Vbd, and the application of the voltage Vd does not cause the OTP memory to break down.

Also in the case of reading the data "0", the data is read by the same method as the method of reading the data "1". However, when the value stored in the OTP memory indicates that the data is "0", the upper electrode UE and the lower electrode LE are insulated from each other, so a current indicating that the data is "1" does not flow. Accordingly, the sense amplifier 14 detects that no current is consumed, to thereby read the data "0". In this case, during the reading operation, when the word line WL is in the selected state and the bit line BL is in the non-selected state, the ground potential VSS is supplied to the bit line BL. Accordingly, data is not read from the OTP memory connected to the non-selected bit line BL.

Further, when the word line WL is set to the non-selected state, the selection transistor is brought into the non-conducting state. In this case, irrespective of the selected/non-selected state of the bit line BL, the selection transistor is in the non-conducting state, so the current that flows from the upper electrode UE to the source diffusion layer is not generated. Accordingly, data is not read from the memory cell connected to the non-selected word line WL.

As apparent from the above description, in the OTP cell according to the first embodiment, the shape of at least a part of each end of the lower electrode forming region which is in contact with the first insulating film 31 is sharper than the shape of each end of the channel region which is in contact with the second insulating film 32. In other words, the lower electrode LE of the OTP cell of the first embodiment has the sharp portions 33 formed at the ends of the lower electrode LE, while the channel region of the selection transistor has no sharp portion 33 at the ends of the channel region. When a voltage at the upper electrode UE becomes higher than that at the lower electrode LE, the electric field is concentrated on the sharp portions 33 of the lower electrode LE. On the other hand, since the ends of the channel region of the selection transistor have a smoother shape than the sharp portions 33 of the lower electrode LE, even when the voltage is applied to the gate electrode G, an electric field strength generated at the ends of the channel region is smaller than that generated at the sharp portions. For this reason, the breakdown withstand voltage of the OTP cell is lower than that of the selection transistor. Further, because a distance between the tip end of the sharp portion 33 and the upper electrode UE is smaller than a distance between the gate electrode G and the channel region of the selection transistor, the breakdown withstand voltage of the OTP cell is lowered. Accordingly, the OTP cell according to the first embodiment has the breakdown withstand voltage lower than that of the selection transistor.

In a case where the breakdown withstand voltage of the OTP cell is set to be lower than the breakdown withstand voltage of the selection transistor, it is possible to lower the voltage to be applied to the OTP cell during a destructive write to the OTP cell. When the voltage used for the destructive write to the OTP cell can be set lower, the breakdown withstand voltage of the selection transistor can be set to be lower that of the conventional case. Accordingly, even when the breakdown withstand voltage of the selection transistor according to the first embodiment is lowered due to the miniaturization of the transistor, there arises no problem in the actual operation. In other words, the selection transistor of the first embodiment can be downsized by the miniaturization. As a result, the OTP memory can be reduced in chip size.

In general, by the miniaturization of a semiconductor device such as a transistor, high-speed operations can be achieved. Accordingly, by the miniaturization of the selection transistor, a memory operation can be increased in speed.

Moreover, since the voltage used for the destructive write to the OTP cell can be reduced, a low withstand voltage element having a low breakdown withstand voltage can be used also for elements constituting peripheral circuits (for example, charge pump 16 and BL decoder 13) of the OTP cell. The low withstand voltage element has an element size smaller than that of a high withstand voltage element. Accordingly, when the peripheral circuits are each formed of the low withstand voltage element, the chip size can be reduced.

In this case, a description is given of a method of manufacturing the OTP memory cell according to the first embodiment. FIGS. 10A to 29B are cross-sectional diagrams each showing an OTP memory cell obtained after completion of each step of a manufacturing process. Note that the cross-sectional diagrams of FIGS. 10A to 29B correspond to the cross-sectional diagrams of FIGS. 5A and 5B. Further, the OTP cell forming region shown in FIGS. 10A to 29B corresponds to a first element forming region, and the selection transistor forming region shown in FIGS. 10A to 29B corresponds to a second element forming region.

Figure 10B:
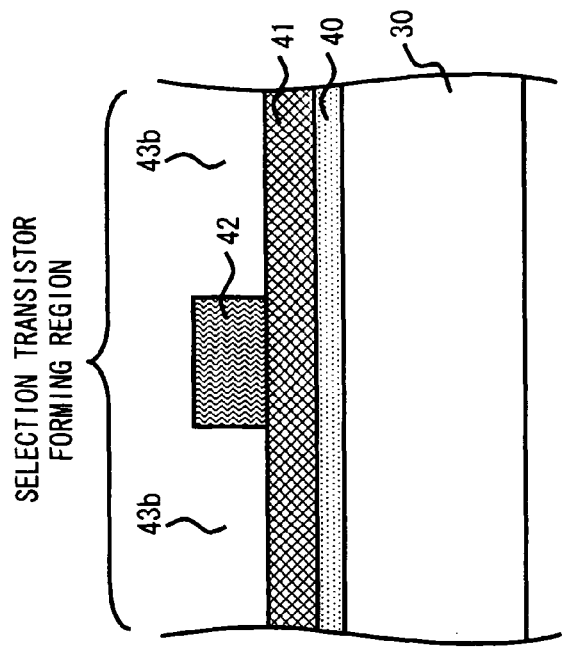
FIGS. 10A and 10B are cross-sectional diagrams each showing a first step of manufacturing the OTP memory cell according to the first embodiment.
Figure 10A:
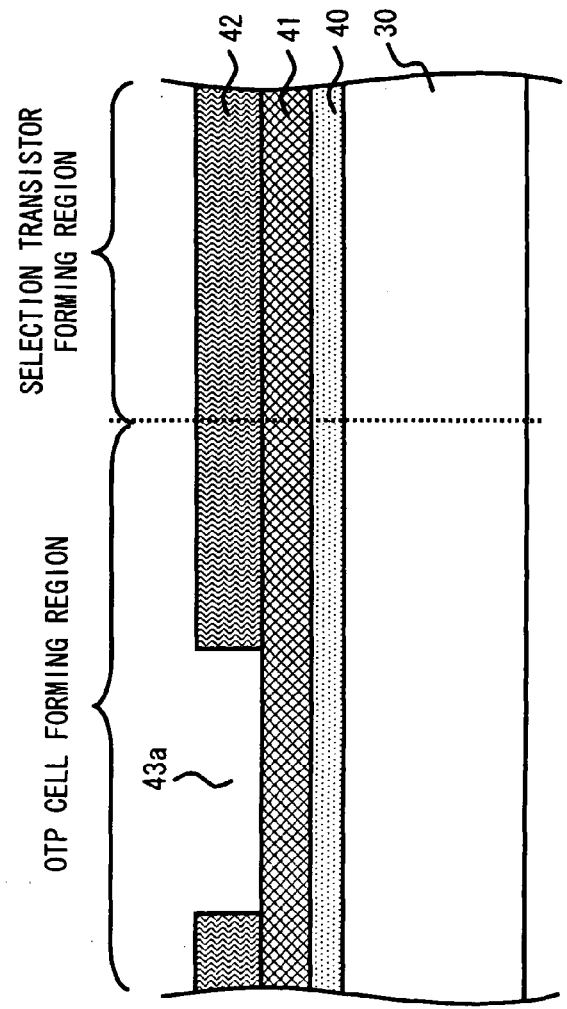

FIGS. 10A and 10B are cross-sectional diagrams each showing an OTP memory cell obtained after completion of a first step (for example, element shape forming step). In the element shape forming step, a pad insulating film (for example, oxide film) 40 and a nitride film 41 are formed on the substrate 30. Then, on the nitride film 41, a resist 42 is formed. The resist 42 is formed so as to cover the lower electrode forming region of the OTP cell forming region and the diffusion layer forming region and the channel region of the selection transistor forming region. A region which is not covered with the resist 42 becomes a field region. Note that, in the following description, an opening of the resist 42, which corresponds to a region of the field region in which the first trench-type insulating region is formed, is referred to as a first opening 43a, and an opening of the resist 42, which corresponds to a region of the field region in which the second trench-type insulating region is formed, is referred to as a second opening 43b. The pad insulating film 40 and the nitride film 41 protect a surface of a semiconductor layer during an etching process or a CVD process which are performed in the manufacturing process for the OTP memory cell.

FIGS. 11A and 11B are cross-sectional diagrams each showing an OTP memory cell obtained after completion of a second step (for example, field forming step). In the field forming step, the first opening 43a and the second opening 43b are etched. As a result, portions of the pad insulating film 40 and the nitride film 41, which are positioned at the first opening 43a and the second opening 43b, are removed. Accordingly, the nitride film 41 has the first opening 43a and the second opening 43b. Further, since an overetching occurs during the etching process, the semiconductor layer (for example, substrate) 30 in the field region 43 is etched, with the result that the substrate 30 has a concave shape in this region with respect to the other region of the substrate 30. In this case, slopes SLP are formed along an outer periphery of an exposed region of the substrate 30. In other words, at an end of the second opening 43b, the slope SLP is formed. Note that the slope formed at the end of the first opening 43a at that time is to be removed in a subsequent step.

Figure 12B:
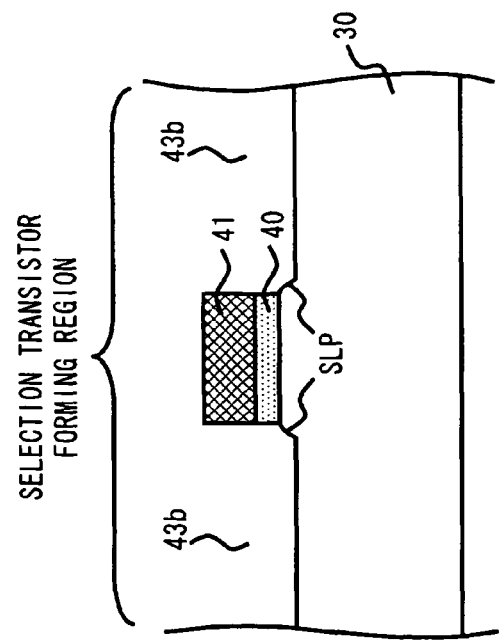
FIGS. 12A and 12B are cross-sectional diagrams each showing a third step of manufacturing the OTP memory cell according to the first embodiment.
Figure 12A:
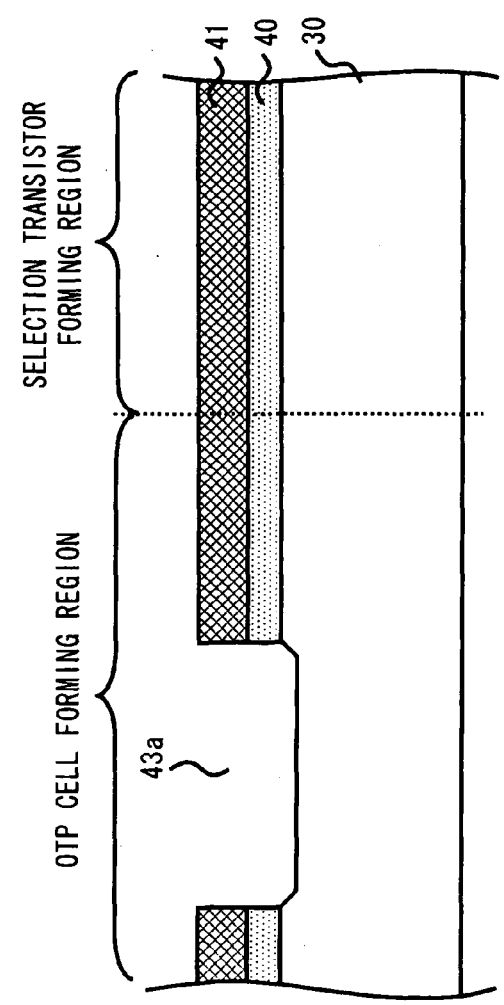

FIGS. 12A and 12B are cross-sectional diagrams each showing an OTP memory cell obtained after completion of a third step (for example, resist removing step). In the third step, the resist 42 formed on the nitride film 41 is removed. Next, a description is given of a slope protection film forming step of protecting the slopes SLP, which are formed in the diffusion layer forming region and the channel region of the selection transistor forming region, from etching performed in a trench forming step that is to be executed in a subsequent step. The slope protection film forming step, which is executed through a plurality of steps, is shown in FIGS. 13A to 17B.

FIGS. 13A and 13B are cross-sectional diagrams each showing an OTP memory cell obtained after completion of a fourth step (for example, first slope protection film forming step). In the first slope protection film forming step, a chemical vapor deposition (CVD) insulating film (for example, oxide film) 44 is formed on an entire surface of a wafer.

Figure 14B:
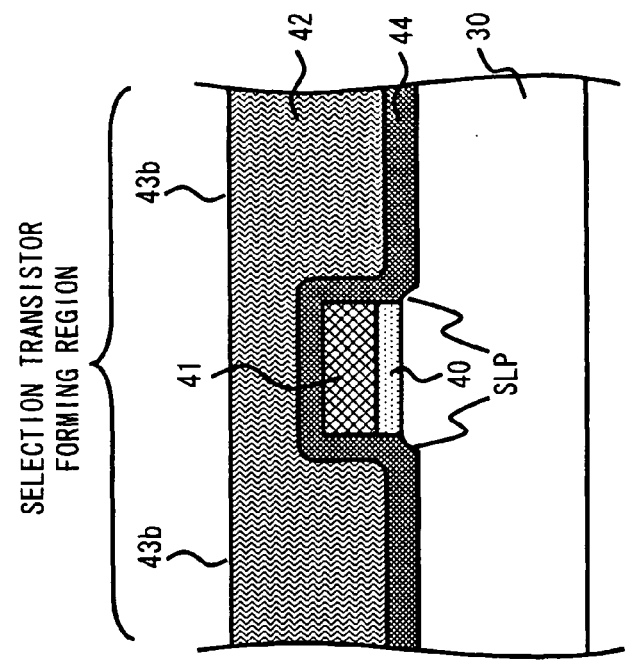
FIGS. 14A and 14B are cross-sectional diagrams each showing a fifth step of manufacturing the OTP memory cell according to the first embodiment.
Figure 14A:
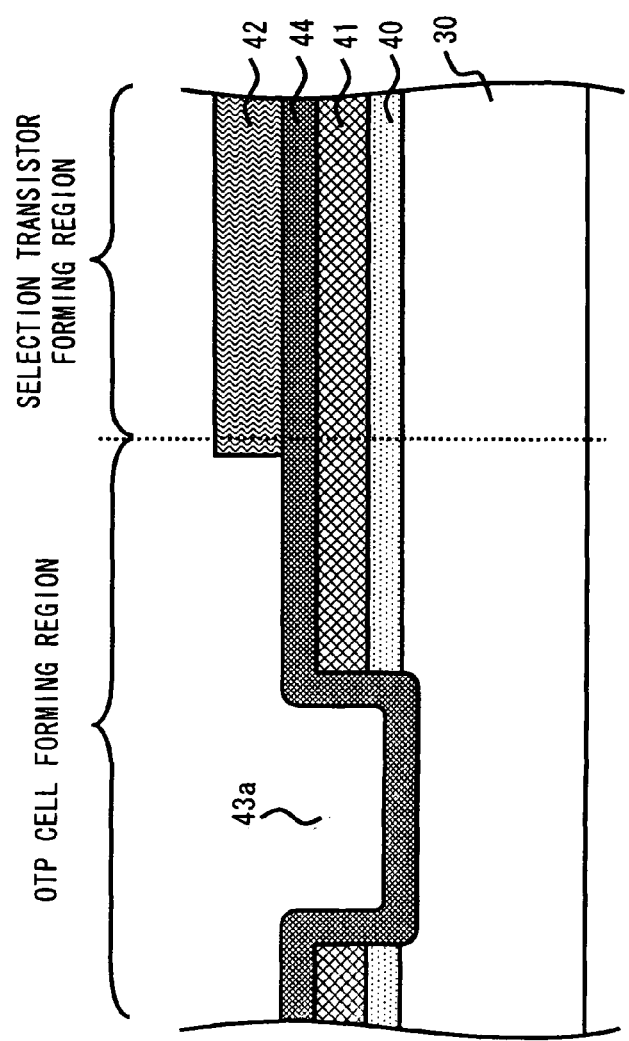

FIGS. 14A and 14B are cross-sectional diagrams each showing an OTP memory cell obtained after completion of a fifth step (for example, second slope protection film forming step). In the second slope protection film forming step, the resist 42 is formed on the CVD insulating film 44 so as to cover the selection transistor forming region. In this case, the CVD insulating film 44 formed in the OTP cell forming region is exposed. Note that the resist 42 is formed so as to slightly stick out to the OTP cell forming region on the CVD insulating film 44, by taking into consideration that the CVD insulating film 44 is to be etched back during the etching to be subsequently performed.

Figure 15B:
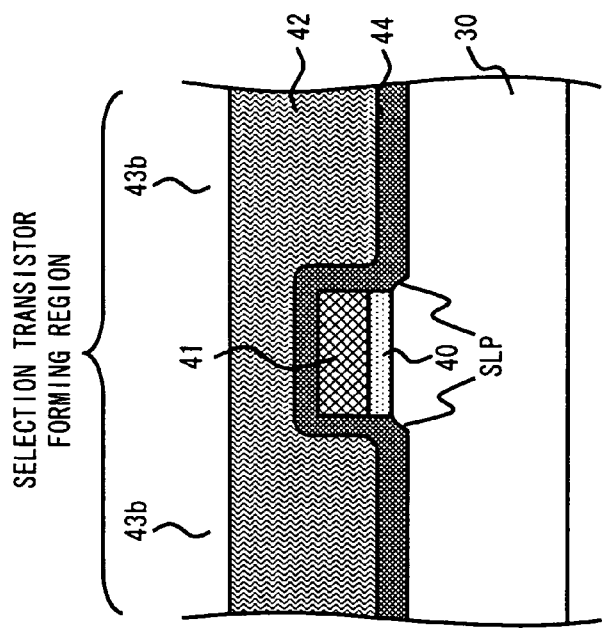
FIGS. 15A and 15B are cross-sectional diagrams each showing a sixth step of manufacturing the OTP memory cell according to the first embodiment.
Figure 15A:
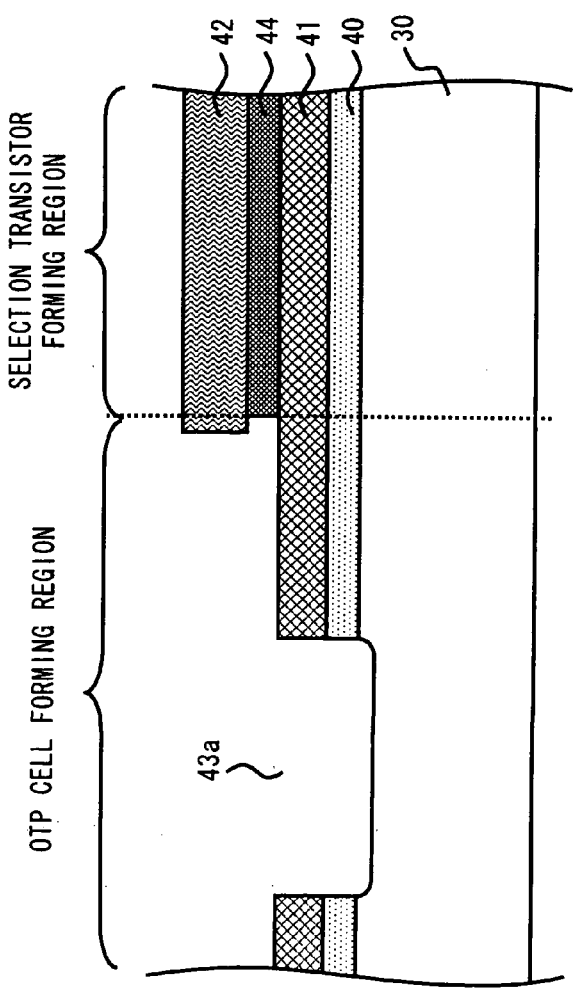

FIGS. 15A and 15B are cross-sectional diagrams each showing an OTP memory cell obtained after completion of a sixth step (for example, third slope protection film forming step). In the third slope protection film forming step, a portion of the CVD insulating film 44, which is not covered with the resist 42, is removed by isotropic etching. In this case, also the portion of the CVD insulating film 44, which is formed under the resist 42, is slightly etched by etch back.

Figure 17B:
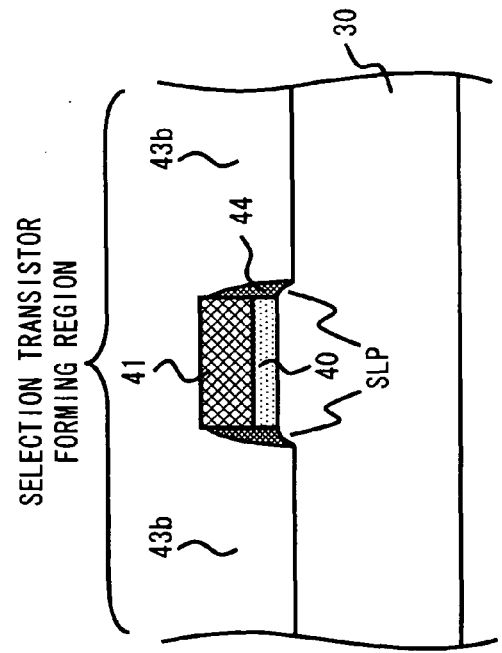
FIGS. 17A and 17B are cross-sectional diagrams each showing an eighth step of manufacturing the OTP memory cell according to the first embodiment.
Figure 17A:
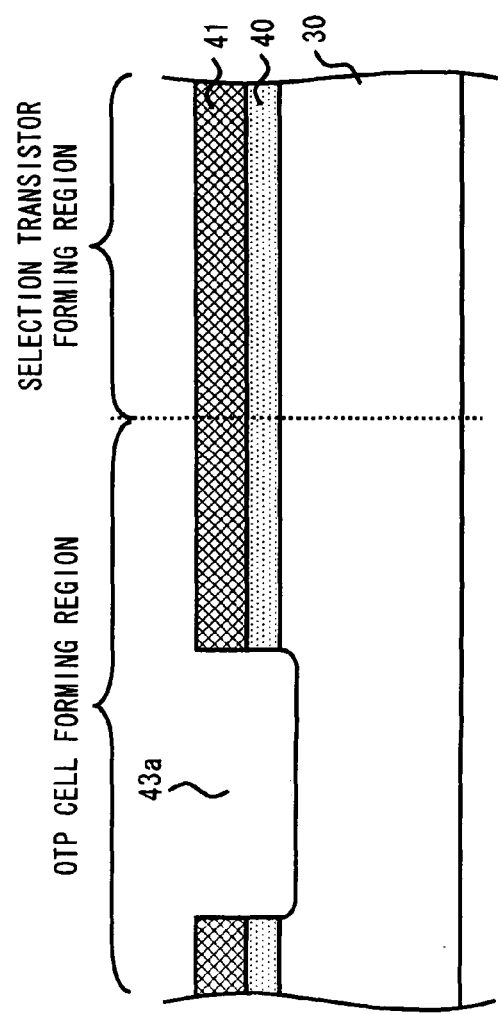

FIGS. 16A and 16B are cross-sectional diagrams each showing an OTP memory cell obtained after completion of a seventh step (for example, fourth slope protection film forming step). In the fourth slope protection film forming step, the resist 42 formed on the CVD insulating film 44 is removed. Further, FIGS. 17A and 17B are cross-sectional diagrams each showing an OTP memory cell after completion of an eighth step (for example, fifth slope protection film forming step). In the fifth slope protection film forming step, the CVD insulating film 44 is removed by isotropic etching. In this case, portions of the CVD insulating film 44, which cover side walls of the nitride film 41 formed in the selection transistor forming region (that is, side walls of nitride film 41 each having second opening 43b), the diffusion layer forming region of the selection transistor forming region, and the slopes SLP of the channel region of the selection transistor forming region, are not etched and remain as side wall insulating films (denoted by reference numeral 44 of FIG. 17B).

FIGS. 18A and 18B are cross-sectional diagrams each showing an OTP memory cell obtained after completion of a ninth step (for example, trench forming step). In the trench forming step, the pad insulating film 40, the nitride film 41, and the CVD insulating film 44 are used as a mask, and portions of the substrate 30, which are positioned at the first opening 43a and the second opening 43b, are etched. As a result, the substrate 30 has trenches at positions corresponding to the first opening 43a and the second opening 43b. In this case, a top surface of a portion of the substrate 30, which is covered with the nitride film 41 and the CVD insulating film 44 in the selection transistor forming region (that is, portion corresponding to diffusion layer forming region and channel region), has ends with a curved shape, because the slopes SLP are protected by the CVD insulating films 44. On the other hand, a top surface of a portion of the substrate 30, which is covered with the pad insulating film 40 and the nitride film 41 in the OTP cell forming region (that is, portion corresponding to lower electrode forming region), has no curved shape at ends thereof, because the CVD insulating films 44 are not formed thereon. In other words, by the step, the slopes formed at the ends of the first opening 43a are removed.

Figures 19A, 19B:
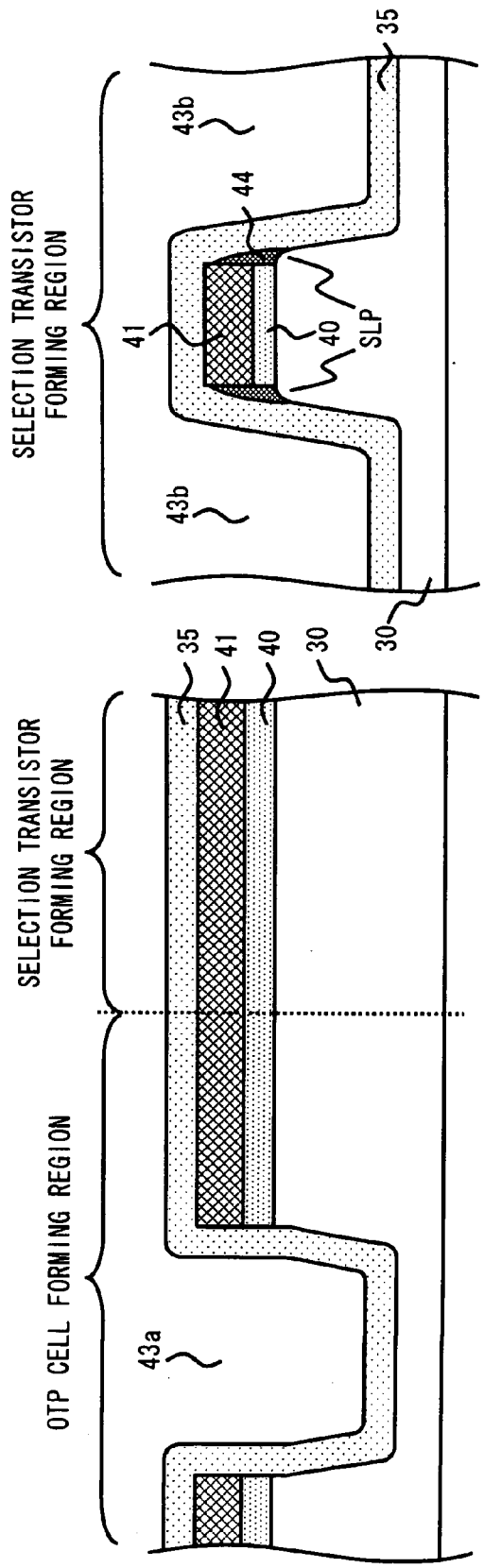
FIGS. 19A and 19B are cross-sectional diagrams each showing a tenth step of manufacturing the OTP memory cell according to the first embodiment.

Subsequently, in a trench-type insulating region forming step, a trench-type insulating region is formed. In the trench-type insulating region forming step is divided into a first trench-type insulating region forming step and a second trench-type insulating region forming step to be performed. FIGS. 19A and 19B are cross-sectional diagrams each showing an OTP memory cell obtained after completion of a tenth step (for example, first trench-type insulating region forming step). In the first trench-type insulating region forming step, the thermal reaction insulating film (for example, oxide film) 35 is formed on the wafer surface by using a CVD technique. The thermal reaction insulating film 35 is formed by setting an atmosphere of a reaction chamber, which contains a material gas, to high temperature. In the case of forming the thermal reaction insulating film 35, reaction energy is supplied using thermal energy. As a result, a damage to a processed surface can be reduced as compared with a case of forming a plasma reaction insulating film. Further, it is assumed that the thermal reaction insulating film 35 has a thickness large enough to suppress the damage to the processed surface.

Next, FIGS. 20A and 20B are cross-sectional diagrams each showing an OTP memory cell obtained after completion of an eleventh step (for example, second trench-type insulating region forming step). In the second trench-type insulating region forming step, the plasma reaction insulating film (for example, oxide film) 36 is formed using plasma reaction. The plasma reaction insulating film 36 is formed so as to fill the field region 43. Then, the first opening 43a and the second opening 43b each filled with the thermal reaction insulating film 35 and the plasma reaction insulating film 36 become the trench-type insulating regions. Note that the trench-type insulating region formed at a position corresponding to the first opening 43a corresponds to the first trench-type insulating region STI1, and the trench-type insulating region formed at a position corresponding to the second opening 43b corresponds to the second trench-type insulating region STI2. Further, the first trench-type insulating region STI1 is an insulating region which is formed in the OTP cell forming region and is in contact with the lower electrode forming region. The second trench-type insulating region STI2 is an insulating region which is formed in the selection transistor forming region and is in contact with the diffusion layer forming region and the channel region.

FIGS. 21A and 21B are cross-sectional diagrams each showing an OTP memory cell obtained after completion of a twelfth step (for example, planarization step). In the planarization step, a portion of the plasma reaction insulating film 36 and the thermal reaction insulating film 35, which is formed on the wafer surface, is removed by using a chemical mechanical polishing (CMP) technique. As a result, the nitride film 41 is exposed, and in a region in which the nitride film 41 is not formed, the insulating film formed in the trench-type insulating region is exposed. After completion of the planarization step, a planarized wafer surface is obtained.

Figure 22B:
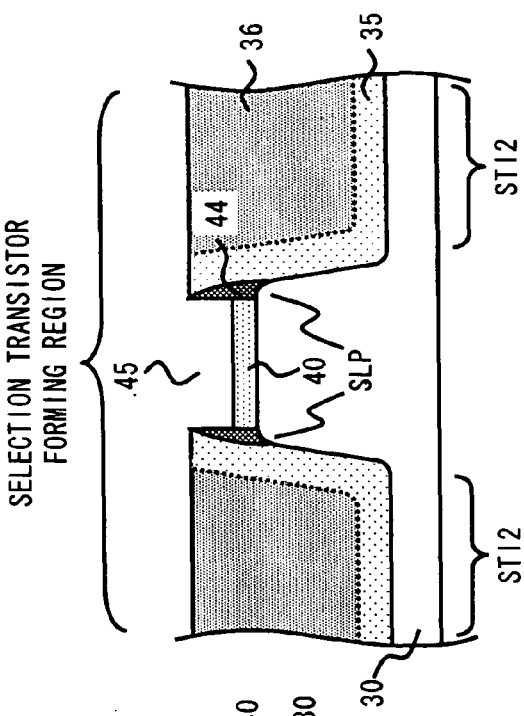
FIGS. 22A and 22B are cross-sectional diagrams each showing a thirteenth step of manufacturing the OTP memory cell according to the first embodiment.
Figure 22A:
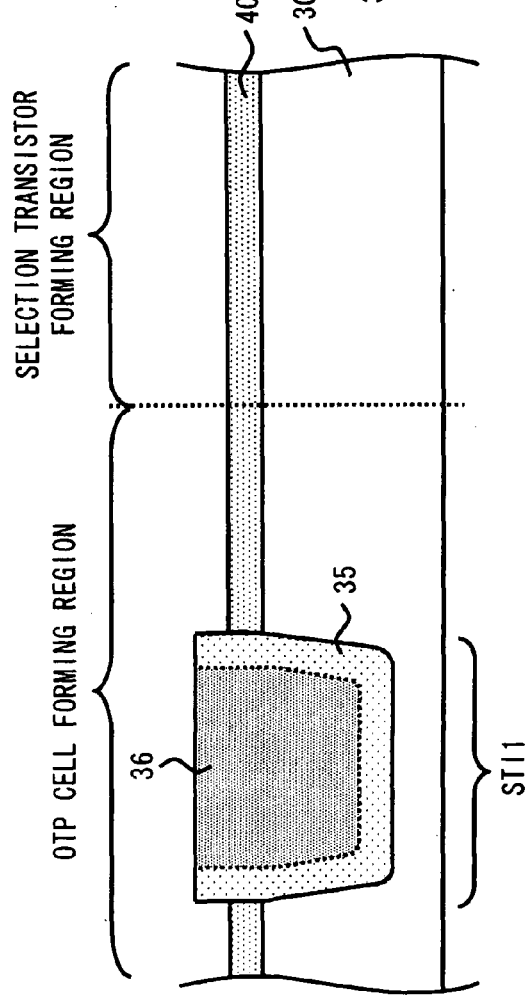

FIGS. 22A and 22B are cross-sectional diagrams each showing an OTP memory cell obtained after completion of a thirteenth step (for example, protection film removing step). In the protection film removing step, the nitride film 41 is removed by wet etching. As a result, the nitride film 41 is removed, and the first trench-type insulating region STI1 and the second trench-type insulating region STI2 each have a shape projecting from the portion having being covered with the nitride film 41. Further, FIGS. 23A and 23B are cross-sectional diagrams each showing an OTP memory cell obtained after completion of a fourteenth step (for example, well implantation step). In the well implantation step, ions are separately implanted for each chip region. Accordingly, in the well implantation step, formation and removal of the resist are performed for each type of ions to be implanted. In the resist removing step, the wafer surface is scraped off in some positions. In the first embodiment, at a portion corresponding to a step of the wafer surface (for example, step portion formed between top surface of first trench-type insulating region STI1 or top surface of second trench-type insulating region STI2, and top surface of another portion), the etching advances. Accordingly, in a portion in which the etching advances, a hollow is formed. Hereinafter, the hollow is called "divot". The divot is formed along the vicinity of the outer periphery of each of the first trench-type insulating region STI1 and the second trench-type insulating region STI2. After that, ions such as boron are implanted into the substrate 30, and the substrate 30 thus obtained functions as a P-type semiconductor.

Figure 24B:
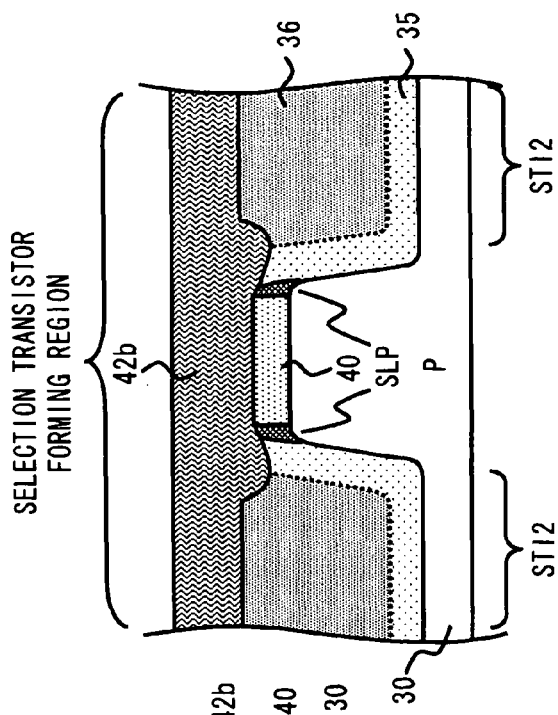
FIGS. 24A and 24B are cross-sectional diagrams each showing a fifteenth step of manufacturing the OTP memory cell according to the first embodiment.
Figure 24A:
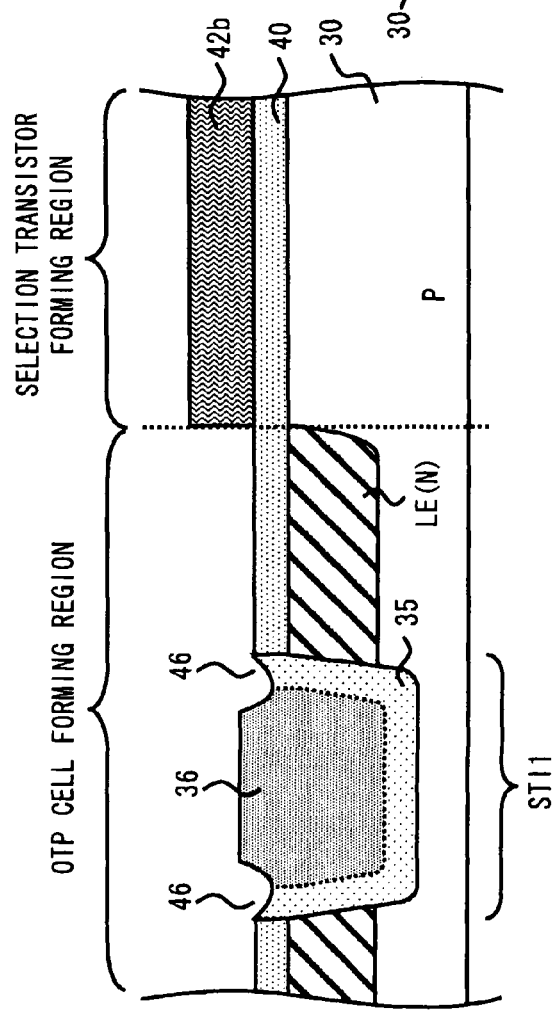

FIGS. 24A and 24B are cross-sectional diagrams each showing an OTP memory cell obtained after completion of a fifteenth step (for example, lower electrode forming step). In the lower electrode forming step, a resist 42b is formed on the wafer surface so that openings are formed in the OTP cell forming region. After that, ions are implanted into the lower electrode forming region, whereby a portion corresponding to the lower electrode LE is formed. In the first embodiment, impurities (for example, phosphorus ions) are implanted thereinto, whereby the lower electrode LE functions as an N-type semiconductor. In this case, since the resist 42b is formed, the phosphorus ions are not implanted into the selection transistor forming region. After the lower electrode LE is formed, the resist 42b is removed.

FIGS. 25A and 25B are cross-sectional diagrams each showing an OTP memory cell obtained after completion of a sixteenth step (for example, divot forming step). In the divot forming step, the pad insulating film 40 is removed by wet etching. In this case, portions of the thermal reaction insulating film 35 and the plasma reaction insulating film 36 are also removed. The thermal reaction insulating film 35 and the plasma reaction insulating film 36 are insulating films of the same type, but have different chemical bonding states. In the chemical bonding states, a bonding state at a boundary therebetween is weakest. For this reason, at the boundary therebetween, an etching reaction is more likely to occur than in other portions, and divots 46 and 47 are deepest at a boundary surface between the thermal reaction insulating film 35 and the plasma reaction insulating film 36. In other words, the divots 46 are each formed along an outer peripheral portion within the first trench-type insulating region STI1, and the divots 47 are each formed along an outer peripheral portion within the second trench-type insulating region STI2. Further, the divots 46 formed in the step each have a bottom surface which is spaced apart from the lower electrode forming region. In other words, an end surface of the lower electrode forming region, which is in contact with the first trench-type insulating region STI1, is still covered with the thermal reaction insulating film 35.

FIGS. 26A and 26B are cross-sectional diagrams each showing an OTP memory cell obtained after completion of a seventeenth step (for example, insulating film forming step). In the insulating film forming step, by heating the wafer in the reaction chamber having an oxygen atmosphere, for example, each surface of the lower electrode forming region, the diffusion layer forming region, and the channel region is oxidized, whereby an insulating film (for example, oxide film) 48 is obtained. In this case, since the end surface of the lower electrode forming region, which is in contact with the first trench-type insulating region STI1, is covered with the thermal reaction insulating film, which prevents oxidizing species from entering. As a result, the oxide film has a small thickness at the end surface of the lower electrode forming region, which is in contact with the first trench-type insulating region STI1, and the end of the lower electrode LE has a sharp shape (portion having this sharp shape is referred to as "sharp portion 33"). On the other hand, an upper portion of an end surface of the diffusion layer forming region and the channel region in the selection transistor forming region, which is in contact with the second trench-type insulating region STI2, is exposed, so the oxidizing species are not inhibited from entering. Accordingly, on the diffusion layer forming region and the channel region, the insulating film 48 is formed with a uniform thickness.

FIGS. 27A and 27B are cross-sectional diagrams each showing an OTP memory cell obtained after completion of an eighteenth step (for example, polysilicon forming step). In the polysilicon forming step, a polysilicon 49 is deposited on the wafer surface. After that, a resist 42c is formed so as to conform to the shape of each of the upper electrode UE and the gate electrode G. In this case, the polysilicon 49 filled in the divot portions forms the projections 34.

Figures 28A, 28B:
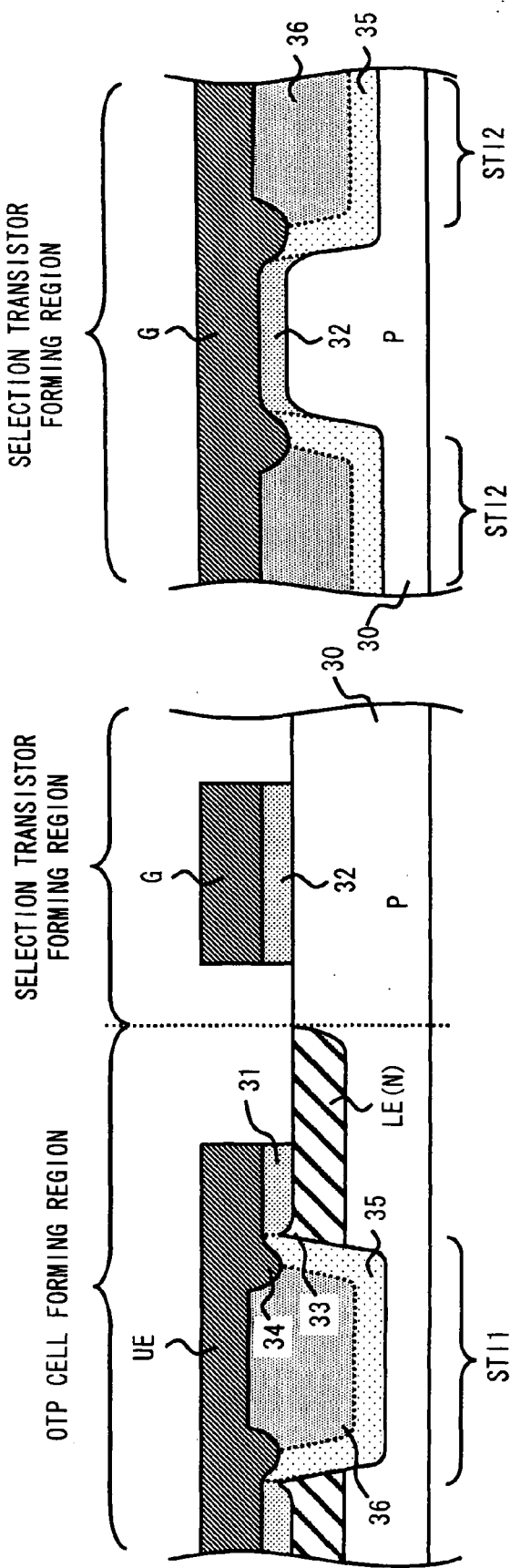
FIGS. 28A and 28B are cross-sectional diagrams each showing a nineteenth step of manufacturing the OTP memory cell according to the first embodiment.

FIGS. 28A and 28B are cross-sectional diagrams each showing an OTP memory cell obtained after completion of a nineteenth step (for example, electrode forming step). In the electrode forming step, portions of the polysilicon 49 and the insulating film 48, which are not covered with the resist 42c, are removed. After that, the resist 42c is also removed. As a result, the polysilicon 49 and the insulating film 48 of the OTP cell forming region are separated from those of the selection transistor forming region. In this case, the polysilicon 49 of the OTP cell forming region becomes the upper electrode UE, and the polysilicon 49 of the selection transistor forming region becomes the gate electrode G. Further, the insulating film 48 of the OTP cell forming region becomes the first insulating film 31, and the insulating film 48 of the selection transistor forming region becomes the second insulating film 32.

Figure 29B:
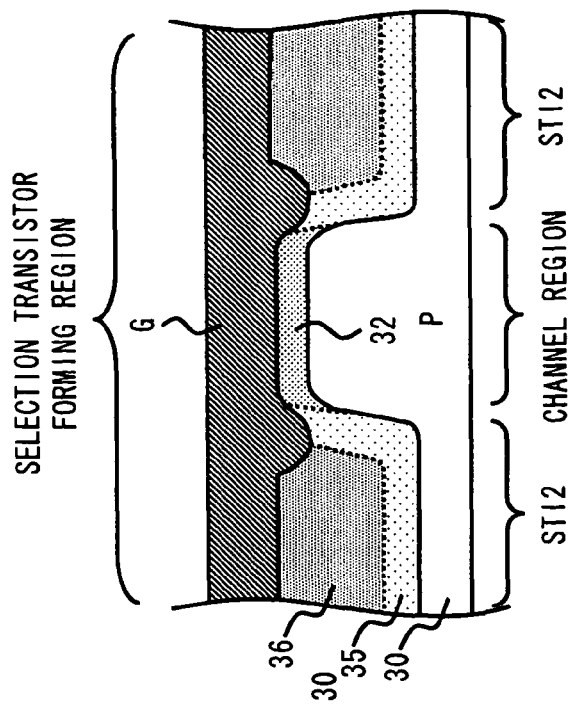
FIGS. 29A and 29B are cross-sectional diagrams each showing a twentieth step of manufacturing the OTP memory cell according to the first embodiment.
Figure 29A:
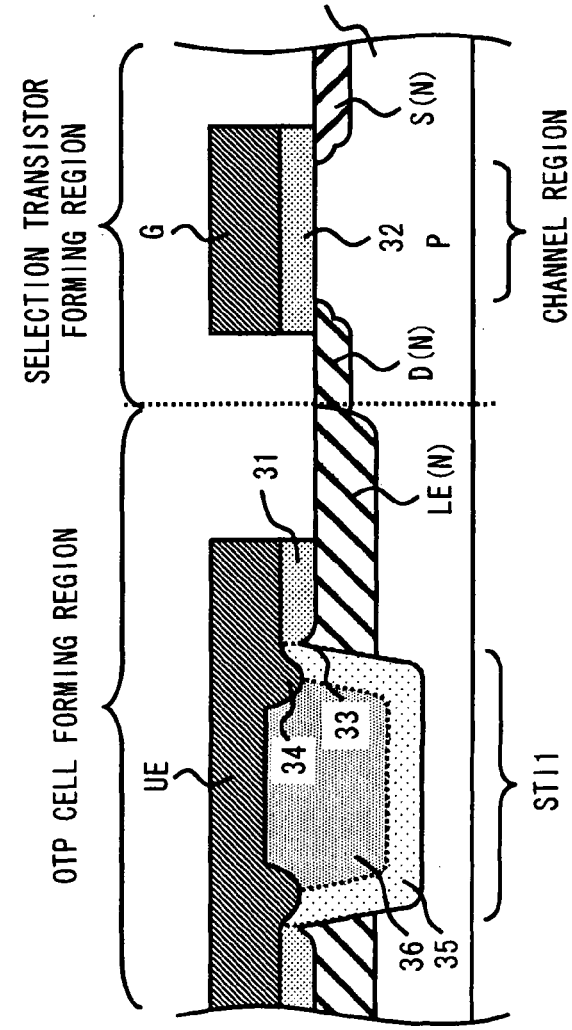

FIGS. 29A and 29B are cross-sectional diagrams each showing an OTP memory cell obtained after completion of a twentieth step (for example, diffusion layer forming step). In the diffusion layer forming step, the gate electrode G and the upper electrode UE are each used as an ion implantation blocking film, and N-type ions are implanted into the diffusion layer forming region, to thereby form diffusion layers serving as the source S and the drain D of the selection transistor. In the first embodiment, phosphorus ions are implanted, whereby the source S and the drain D each function as an N-type conductor. Note that the ions to be implanted are not limited to the phosphorus ions, but arsenic ions and the like may be used. The ions to be implanted can be appropriately selected depending on the device to be manufactured.

By the above-described steps, the OTP memory cell according to the first embodiment can be formed. In the above description, the OTP cell and the selection transistor are illustrated, but transistors of peripheral circuits can be formed by the same process as that for the selection transistor. Note that, in the peripheral circuits, transistors having different conductivity types are used, so an additional step can be appropriately provided according to the conductivity type of the transistor.

In the first embodiment, since the breakdown withstand voltage of the OTP cell is lower than that of the conventional OTP cell, the breakdown withstand voltage of the selection transistor may be set to a level substantially equal to that of the transistor of the peripheral circuit. In other words, by manufacturing the transistor of the peripheral circuit and the selection transistor by the same process, it is possible to miniaturize the selection transistor. Further, by manufacturing the transistor of the peripheral circuit and the selection transistor by the same process, it is possible to reduce the number of manufacturing processes as compared with the conventional OTP memory.

Second Embodiment

Figure 30A:
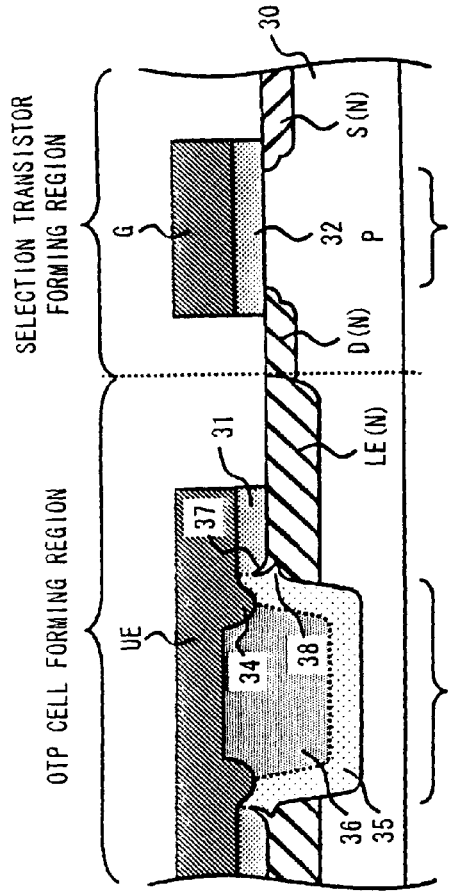
FIGS. 30A to 30C are cross-sectional diagrams each showing an OTP memory cell according to a second embodiment of the present invention.
Figure 30C:
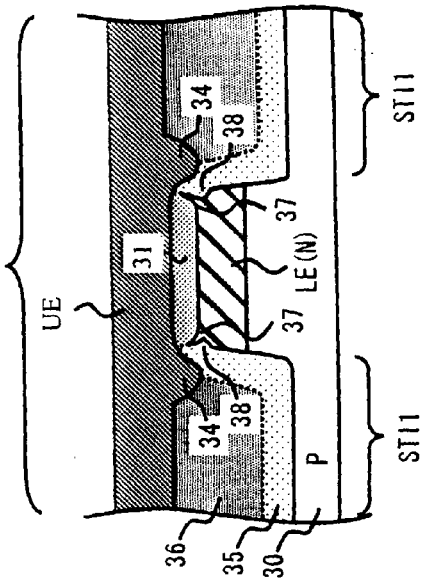
Figure 30B:
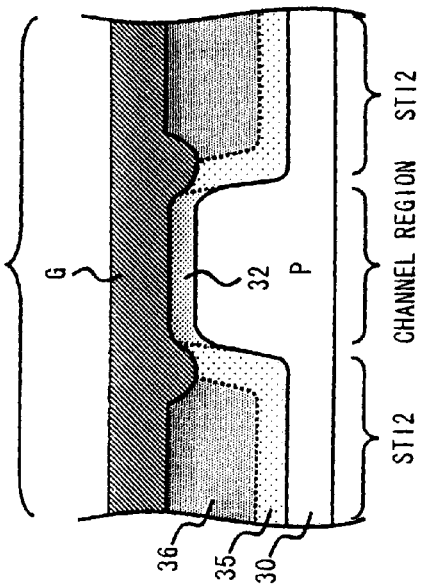

FIGS. 30A to 30C are cross-sectional diagrams each showing an OTP memory cell according to a second embodiment of the present invention, which correspond to the cross-sectional diagrams of FIGS. 5A to 5C each showing the OTP memory cell according to the first embodiment. As shown in FIGS. 30A to 30C, the OTP cell according to the second embodiment has a hollow portion 38 in the side wall in contact with the first trench-type insulating region STI1 of the lower electrode LE. In this case, each sharp portion having the hollow portion 38 is referred to as a sharp portion 37.

The sharp portion 37 having the hollow portion 38 is thinner than the sharp portion 33 of the first embodiment. As a result, the strength of an electric field concentrated on the sharp portion 37 is greater than that on the sharp portion 33. Accordingly, the OTP cell of the second embodiment has a breakdown withstand voltage lower than that of the OTP cell of the first embodiment.

Figure 31B:
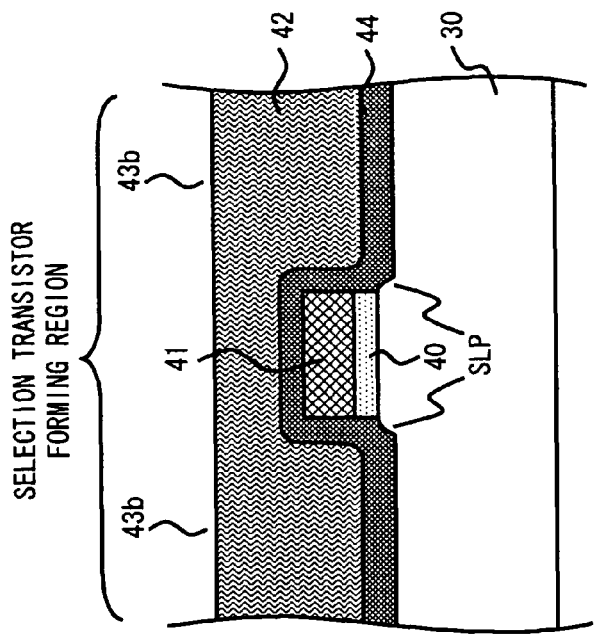
FIGS. 31A and 31B are cross-sectional diagrams each showing a step added to a manufacturing process for the OTP memory cell according to the second embodiment.
Figure 31A:
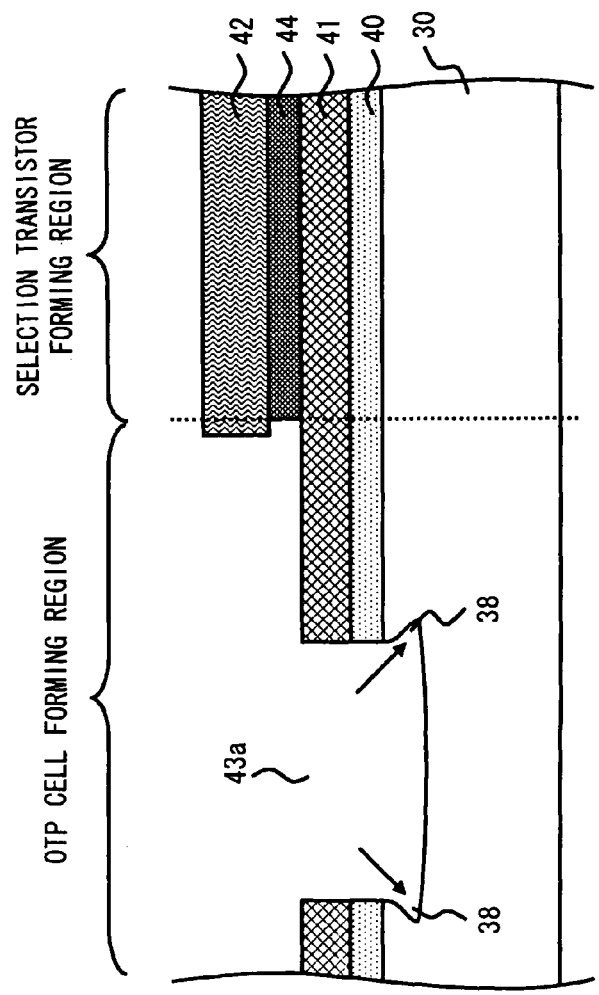

The hollow portion 38 can be formed by adding one step to the manufacturing process of the first embodiment. The additional step is provided between the third slope protection film forming step (see FIGS. 15A and 15B) and the fourth slope protection film forming step (see FIGS. 16A and 16B). In the second embodiment, the third slope protection film forming step is referred to as an etching preparation step, and the additional step is referred to as a hollow portion forming step. FIGS. 31A and 31B are cross-sectional diagrams each showing an OTP memory cell obtained after completion of the hollow portion forming step. In the hollow portion forming step, isotropic etching is performed on a portion the substrate 30, which is exposed as the bottom surface of the first opening 43a in the third slope protection film forming step. As a result, the hollow portions 38 are formed in side wall portions of the exposed substrate 30. In this case, the area of the exposed portion of the substrate 30 is larger than the opening area of the opening portion.

As apparent from the above description, the hollow portion 38 can be formed only by adding one step. As a result, the breakdown withstand voltage of the OTP cell can be lowered.

Third Embodiment

Figure 32:
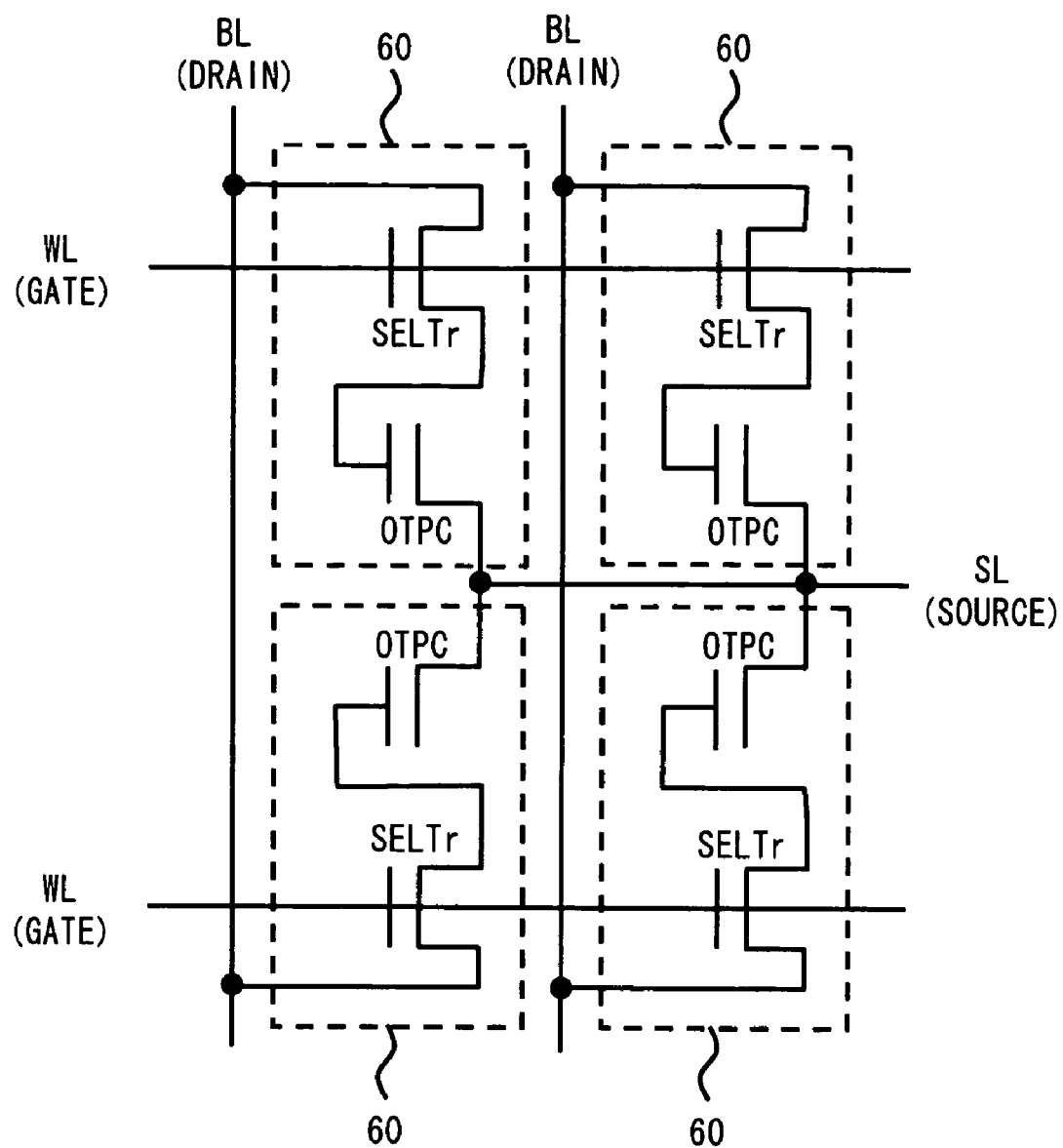
FIG. 32 is a circuit diagram showing an OTP memory cell according to a third embodiment of the present invention.

A third embodiment of the present invention is a modified example of the OTP cell of the first embodiment. Accordingly, the components identical with those of the first embodiment are omitted. FIG. 32 shows a circuit diagram of the OTP memory cell according to the third embodiment.

Figure 33:
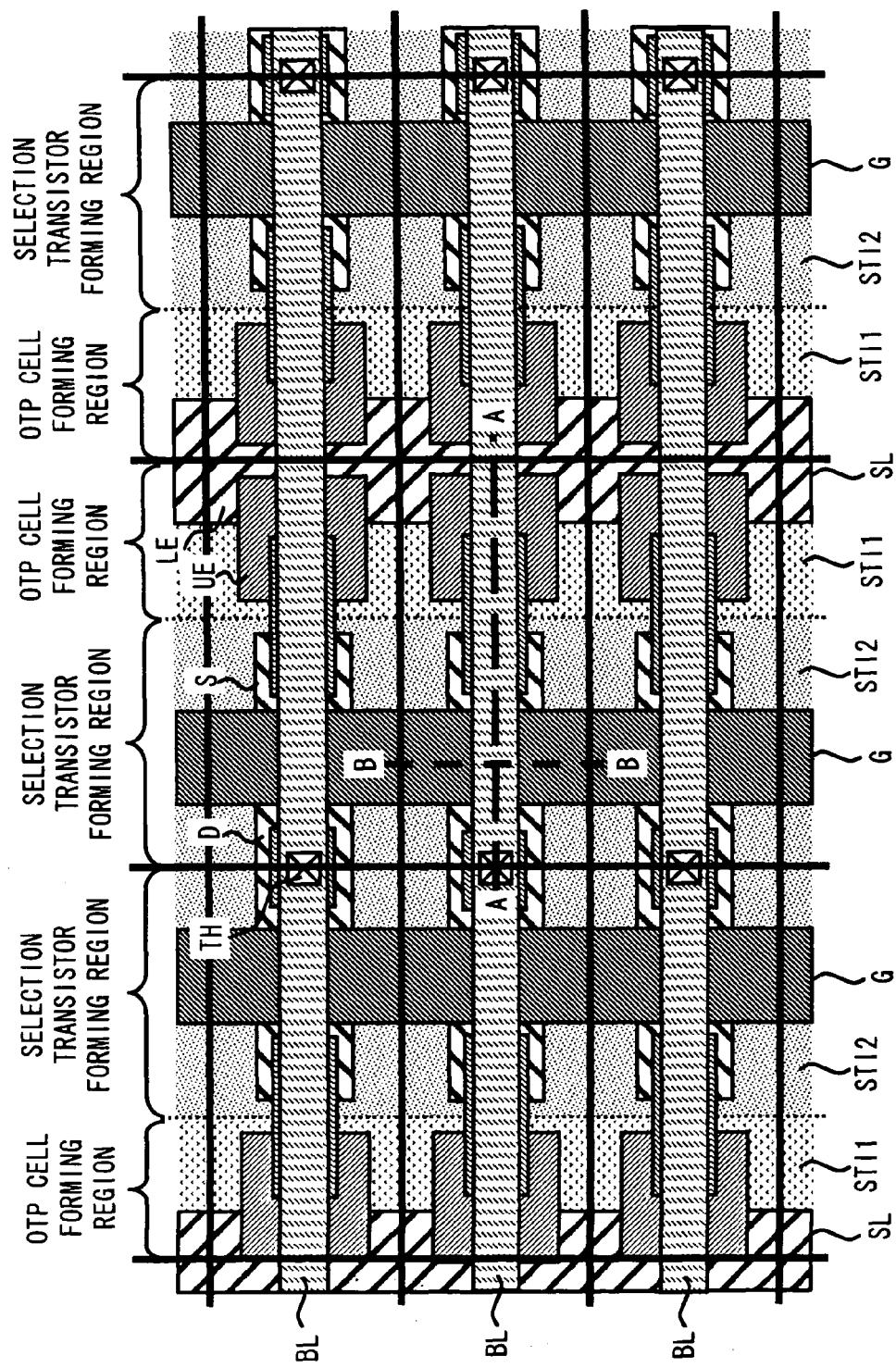
FIG. 33 is a diagram showing a planar layout of the OTP memory cell according to the third embodiment.

As shown in FIG. 32, the OTP memory cell of the third embodiment includes a plurality of OTP memories 60. The OTP memories 60 each include a selection transistor (represented as SELTr of FIG. 32) and an OTP cell (represented as OTPC of FIG. 32). A gate of the selection transistor is connected to the word line WL, and a drain of the selection transistor is connected to the bit line BL. A source of the selection transistor is connected to an upper electrode of the OTP cell. A lower electrode of the OTP cell is connected to the source line SL. FIG. 33 shows a planar layout of the OTP memories 60.

As shown in FIG. 33, in the OTP memory cell of the third embodiment, the lower electrode LE is formed in common with one of the adjacent OTP memories. Further, the drain of the selection transistor is formed in common with the other of the adjacent OTP memories, and is connected with the common bit line BL. Note that, in the third embodiment, a line connecting the lower electrode and the selection transistor to each other in the OTP memory cell is formed in a first wiring layer, and the bit line BL is formed in a second wiring layer which is formed above the first wiring layer. Moreover, the bit line BL is connected to the line of the first wiring layer via a through hole TH, and the line of the first wiring layer is connected to the region formed in the substrate or to the lower electrode via the contact CT.

Figure 34B:
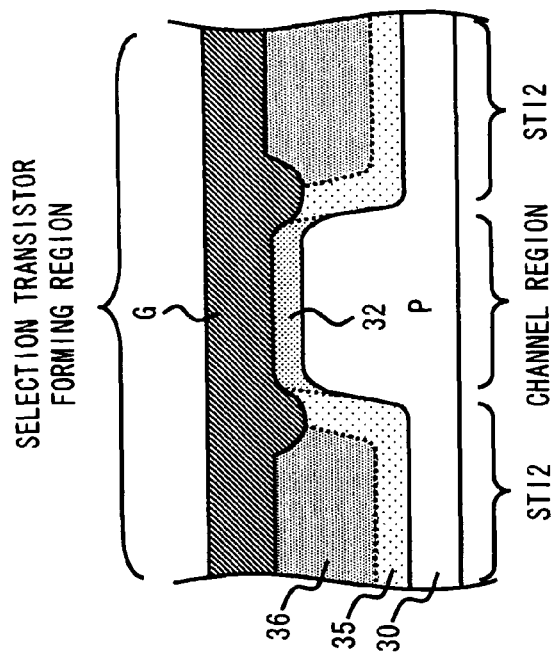
FIGS. 34A and 34B are cross-sectional diagrams each showing the OTP memory cell according to the third embodiment.
Figure 34A:
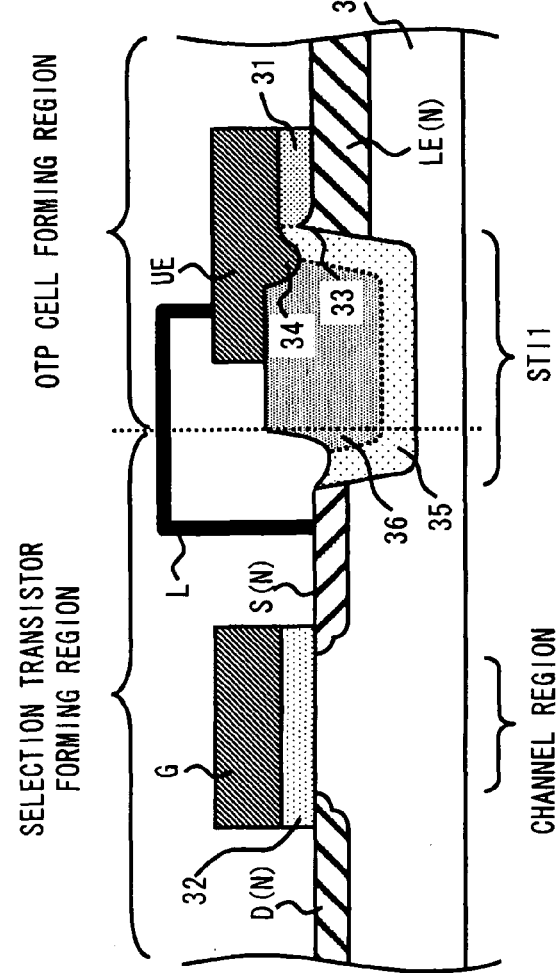

FIGS. 34A and 34B are cross-sectional diagrams each showing the OTP memory cell according to the third embodiment. FIG. 34A is a cross-sectional diagram showing a portion taken along the line A-A of FIG. 33. FIG. 34B is a cross-sectional diagram showing a portion taken along the line B-B of FIG. 33. As shown in FIG. 34B, a cross section viewed from the direction orthogonal to the channel direction of the selection transistor has the same shape as that of the selection transistor of the first embodiment.

On the other hand, as shown in FIG. 34A, the OTP cell is adjacent to the selection transistor with the first trench-type insulating region STI1 interposed therebetween. The upper electrode UE of the OTP cell is formed so as to cover a part of the upper portion of the first trench-type insulating region STI1. Further, the upper electrode UE is connected to the source S of the selection transistor via a line L. Also in this modified example, the lower electrode LE has the sharp portion 33. Accordingly, in a similar manner as in the first embodiment, the electric field is concentrated on the sharp portion 33, which lowers the breakdown withstand voltage of the OTP cell.

Next, regarding operations of the OTP memory cell, FIG. 35 shows the relation of voltages to be applied to terminals of the OTP memory cell during the writing operation. As shown in FIG. 35, in the third embodiment, when the word line is in the non-selected state and the bit line is in the selected state, operations different from those of the first embodiment are carried out. In the other cases, the operations of the third embodiment similar to those of the first embodiment are carried out. When the word line WL is in the non-selected state and the bit line BL is in the selected state, the selection transistor is brought into the non-conducting state. As a result, even when the bit line BL is in the selected state, a voltage is not applied to the upper electrode UE. Accordingly, a voltage difference between the upper electrode UE and the lower electrode LE becomes 0 V in this case. In the other operations, the relation of the voltages applied to the terminals of the third embodiment is similar to that of the first embodiment. Further, FIG. 36 shows the relation of the voltages to be applied to the terminals of the OTP memory cell during the reading operation. As shown in FIG. 36, also in this case, the reading operation can be performed with the relation of the voltages similar to that of the first embodiment.

In the first embodiment, when the word line is in the non-selected state and the bit line is in the selected state, the voltage difference between the upper electrode UE and the lower electrode LE is about Vbd/2. Accordingly, it is necessary to set the breakdown withstand voltage of the OTP cell to be equal to or larger than Vbd/2. On the other hand, in the third embodiment, when the word line is in the non-selected state and the bit line is in the selected state, the voltage difference between the upper electrode UE and the lower electrode LE is 0 V. In view of the above, the breakdown withstand voltage of the OTP cell of the third embodiment can be set to be lower than that of the OTP cell of the first embodiment.

Fourth Embodiment

Figure 37:
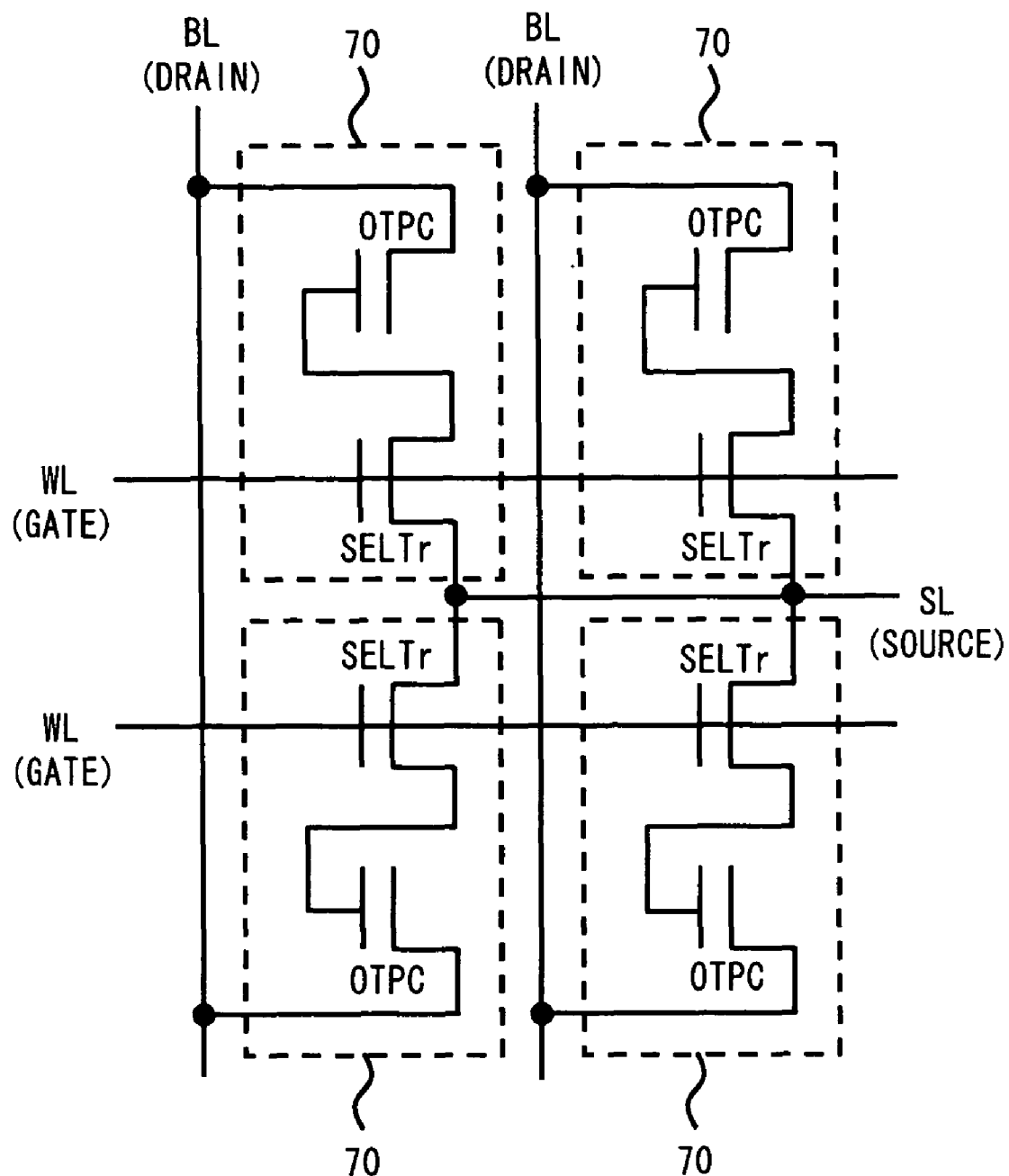
FIG. 37 is a circuit diagram showing an OTP memory cell according to a fourth embodiment of the present invention.

An OTP memory cell according to a fourth embodiment of the present invention includes selection transistors each formed of a PMOS transistor. FIG. 37 shows a circuit diagram of the OTP memory cell according to the fourth embodiment.

Figure 38:
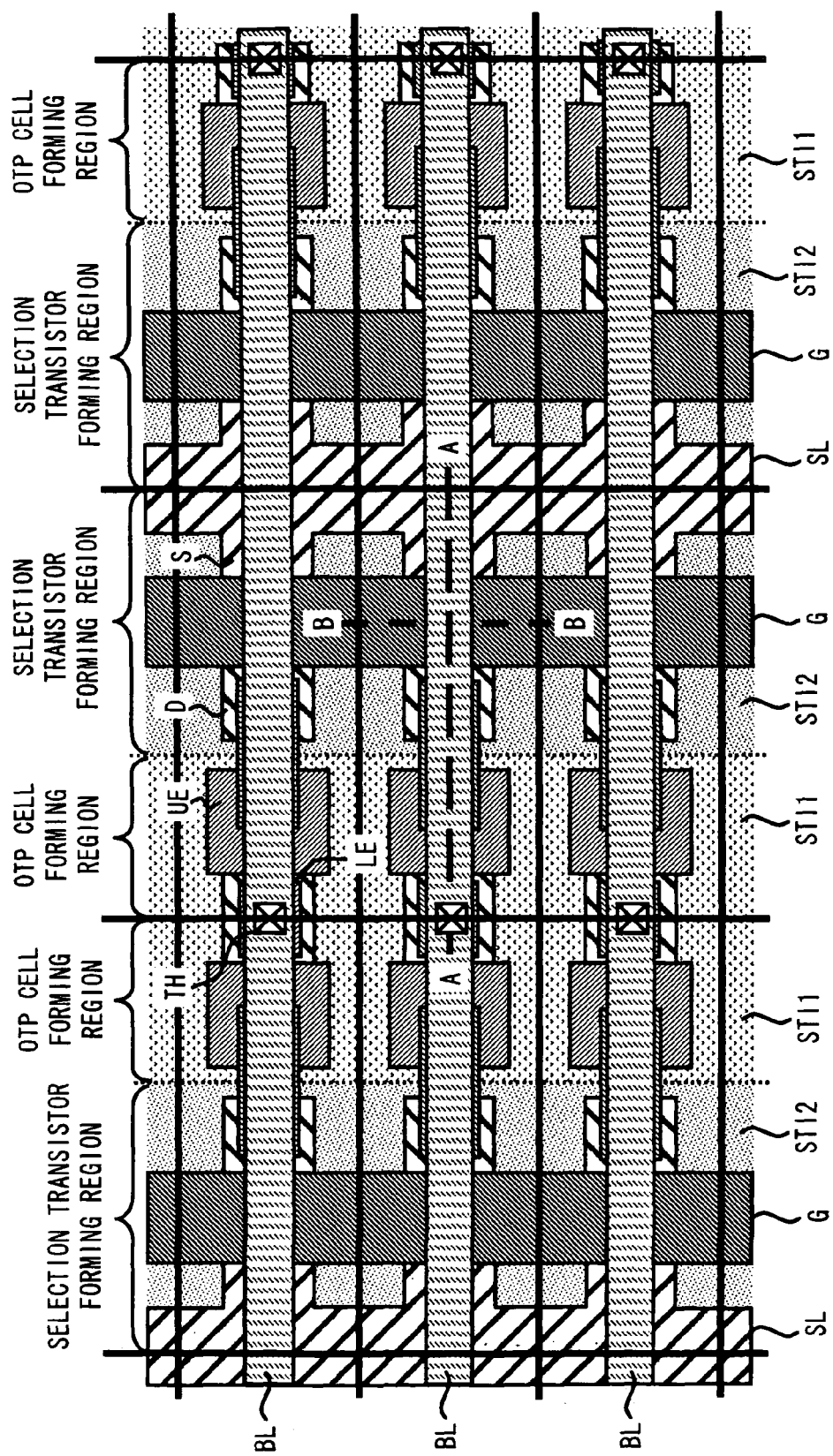
FIG. 38 is a diagram showing a planar layout of the OTP memory cell according to the fourth embodiment.

As shown in FIG. 37, the OTP memory cell of the fourth embodiment includes a plurality of OTP memories 70. The OTP memories 70 each include a selection transistor (represented as SELTr of FIG. 37) and an OTP cell (represented as OTPC of FIG. 37). A gate of the selection transistor is connected to the word line WL, and a source of the selection transistor is connected to the source line SL. A drain of the selection transistor is connected to an upper electrode of the OTP cell. A lower electrode of the OTP cell is connected to the bit line BL. FIG. 38 shows a planar layout of the OTP memories 70.

As shown in FIG. 38, in the OTP memory cell of the fourth embodiment, the source of the selection transistor is formed in common with one of the adjacent OTP memories. Note that the source of the selection transistor is integrally formed with the source line SL. Further, the lower electrode LE of the OTP cell is formed in common with the other of the adjacent OTP memories, and is connected with the common bit line BL. Note that, in the fourth embodiment, a line connecting the lower electrode and the selection transistor to each other in the OTP memory cell is formed in the first wiring layer, and the bit line BL is formed in the second wiring layer which is formed above the first wiring layer. Moreover, the bit line BL is connected to the line of the first wiring layer via the through hole TH, and the line of the first wiring layer is connected to the region formed in the substrate or to the lower electrode via the contact CT.

Figure 39B:
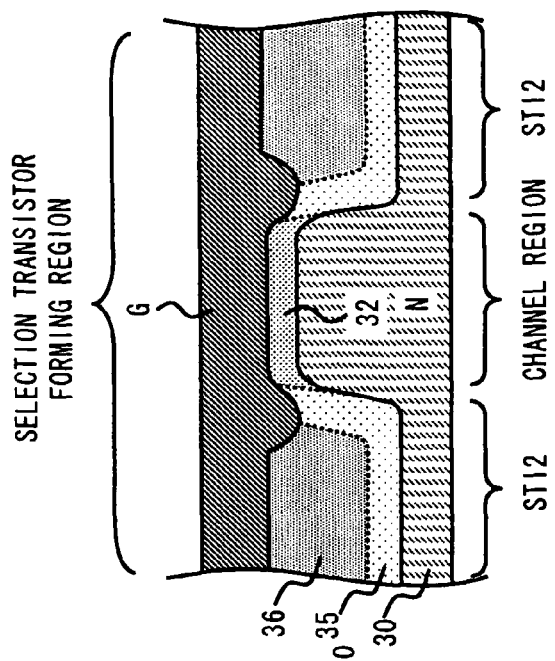
FIGS. 39A and 39B are cross-sectional diagrams each showing the OTP memory cell according to the fourth embodiment.
Figure 39A:
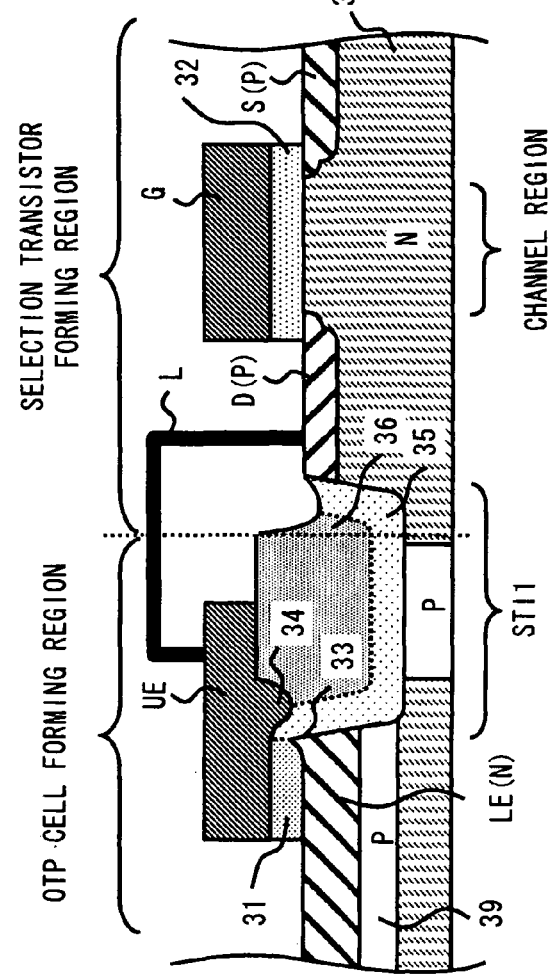

FIGS. 39B and 39B are cross-sectional diagrams each showing the OTP memory cell according to the fourth embodiment. FIG. 39A is a cross-sectional diagram showing a portion taken along the line A-A of FIG. 38. FIG. 39B is a cross-sectional diagram showing a portion taken along the line B-B of FIG. 38. As shown in FIG. 39A, the selection transistor of the fourth embodiment has the source and the drain which are each made of a P-type semiconductor and formed in the upper portion of the substrate 30 made of an N-type semiconductor. Further, the OTP cell has the lower electrode LE which is made of an N-type semiconductor and formed above the substrate 30 made of the N-type semiconductor via an isolation layer 39 made of a P-type semiconductor. As shown in FIG. 39B, a cross section viewed from the direction orthogonal to the channel direction of the selection transistor has the same shape as that of the selection transistor of the first embodiment.

On the other hand, as shown in FIG. 39A, the OTP cell is adjacent to the selection transistor with the first trench-type insulation region STI1 interposed therebetween. The upper electrode UE of the OTP cell is formed so as to cover a part of the upper portion of the first trench-type insulating region. The upper electrode UE is connected to the source S of the selection transistor via the line L. Also in this modified example, the lower electrode LE has the sharp portion 33. Accordingly, in a similar manner as in the first embodiment, the electric field is concentrated on the sharp portion 33, which lowers the breakdown withstand voltage of the OTP cell.

Next, regarding operations of the OTP memory cell, FIG. 40 shows the relation of voltages to be applied to terminals of the OTP memory cell during the writing operation. As shown in FIG. 40, in the fourth embodiment, the voltages to be applied to the terminals in each operation are negative voltages obtained by inverting the voltages applied in the first embodiment. However, an absolute value of each voltage to be applied to the terminals of the OTP memory cell in the fourth embodiment is equal to that of each voltage applied in the first embodiment. FIG. 41 shows the relation of the voltages to be applied to the terminals of the OTP memory cell during the reading operation. As shown in FIG. 41, also in this case, in a similar manner as in the writing operation, the reading operation can be performed with the negative voltages obtained by inverting the voltages applied in the first embodiment.

In other words, even when the PMOS transistor is formed as the selection transistor, the breakdown withstand voltage of the OTP memory can be lowered as in the first embodiment.

Fifth Embodiment

Figure 42:
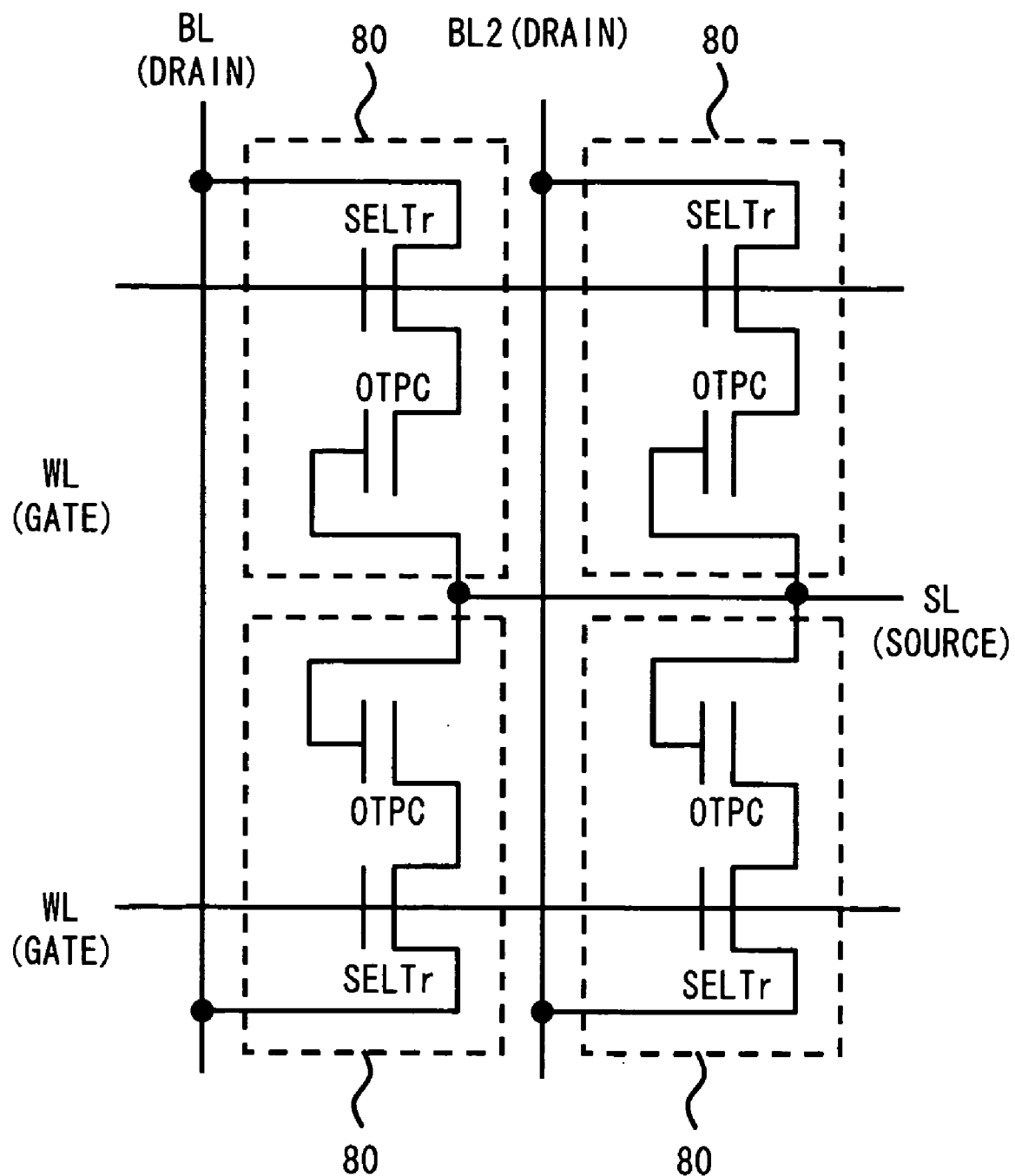
FIG. 42 is a circuit diagram showing an OTP memory cell according to a fifth embodiment of the present invention.

An OTP memory cell according to a fifth embodiment of the present invention includes a PMOS transistor formed as the selection transistor of the OTP memory cell according to the third embodiment. FIG. 42 is a circuit diagram of the OTP memory cell according to the fifth embodiment.

Figure 43:
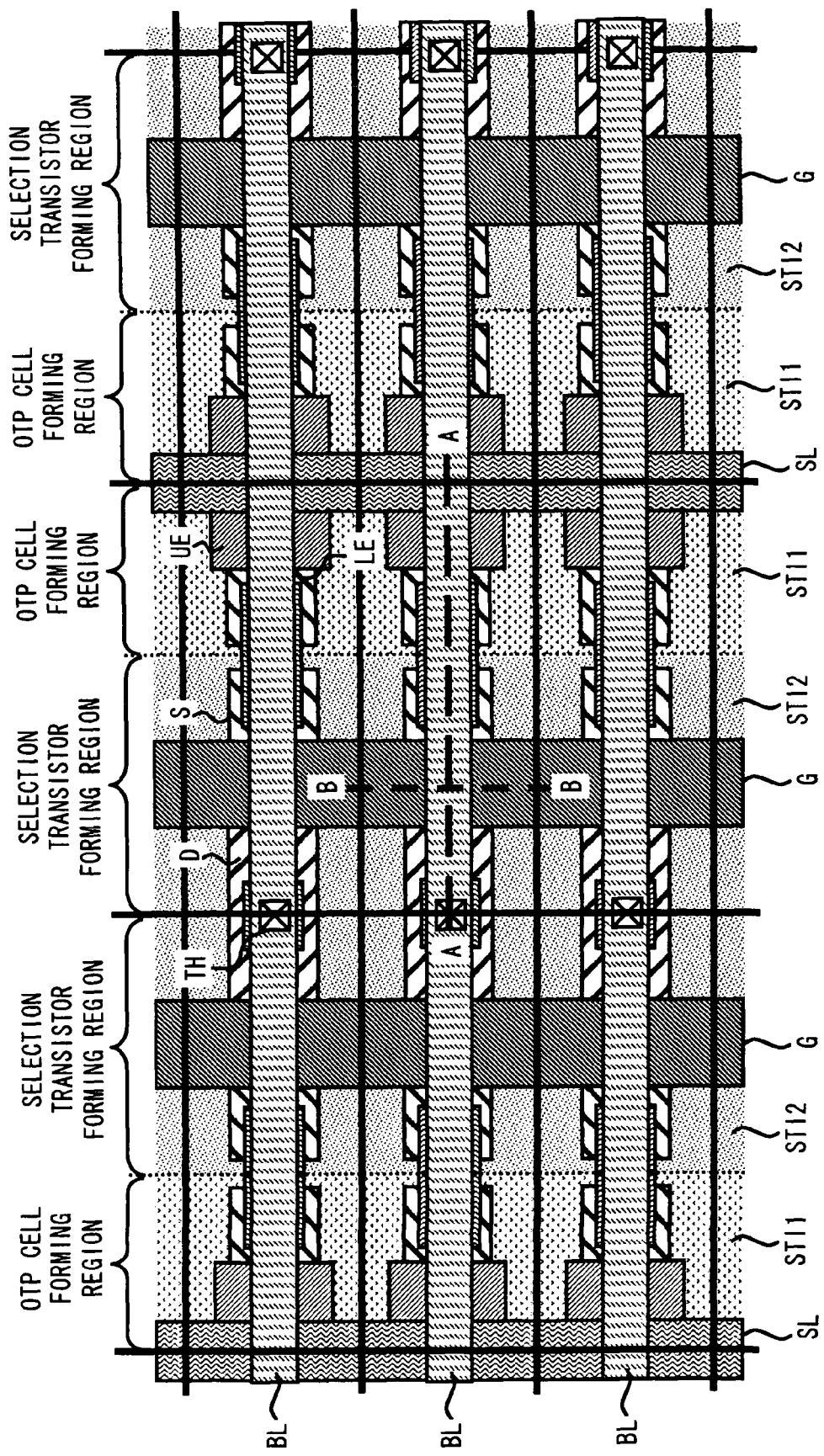
FIG. 43 is a diagram showing a planar layout of the OTP memory cell according to the fifth embodiment.

As shown in FIG. 42, the OTP memory cell of the fifth embodiment includes a plurality of OTP memories 80. The OTP memories 80 each include a selection transistor (represented as SELTr of FIG. 42) and an OTP cell (represented as OTPC of FIG. 42). A gate of the selection transistor is connected to the word line WL, and a drain of the selection transistor is connected to the bit line BL. A source of the selection transistor is connected to a lower electrode of the OTP cell. An upper electrode of the OTP cell is connected to the source line SL. FIG. 43 shows a planar layout of the OTP memories 80.

As shown in FIG. 43, in the OTP memory cell of the fifth embodiment, the upper electrode UE is formed in common with one of the adjacent OTP memories. Further, the drain of the selection transistor is formed in common with the other of the adjacent OTP memories. The drain is used also as the bit line BL. Note that, in the fifth embodiment, a line connecting the lower electrode and the selection transistor to each other in the OTP memory cell is formed in the first wiring layer, and the bit line BL is formed in the second wiring layer which is formed above the first wiring layer. Moreover, the bit line BL is connected to the line of the first wiring layer via the through hole TH, and the line of the first wiring layer is connected to the region formed in the substrate or to the lower electrode via the contact CT.

Figure 44:
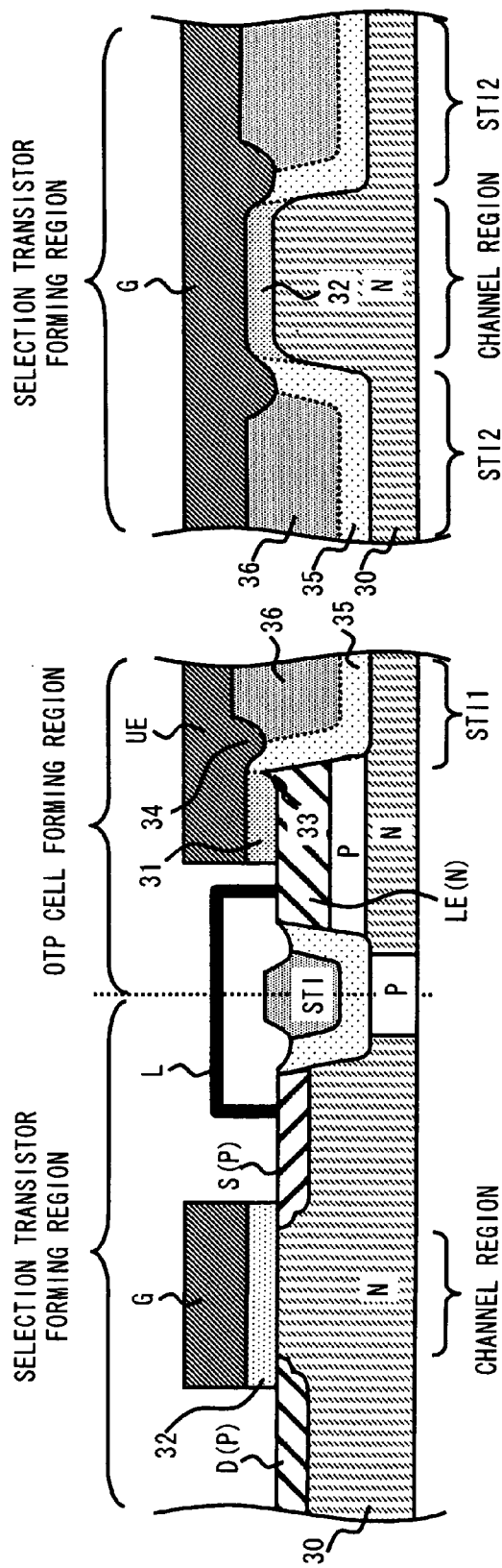
FIGS. 44A and 44B are cross-sectional diagrams each showing the OTP memory cell according to the fifth embodiment.
Figure 47:
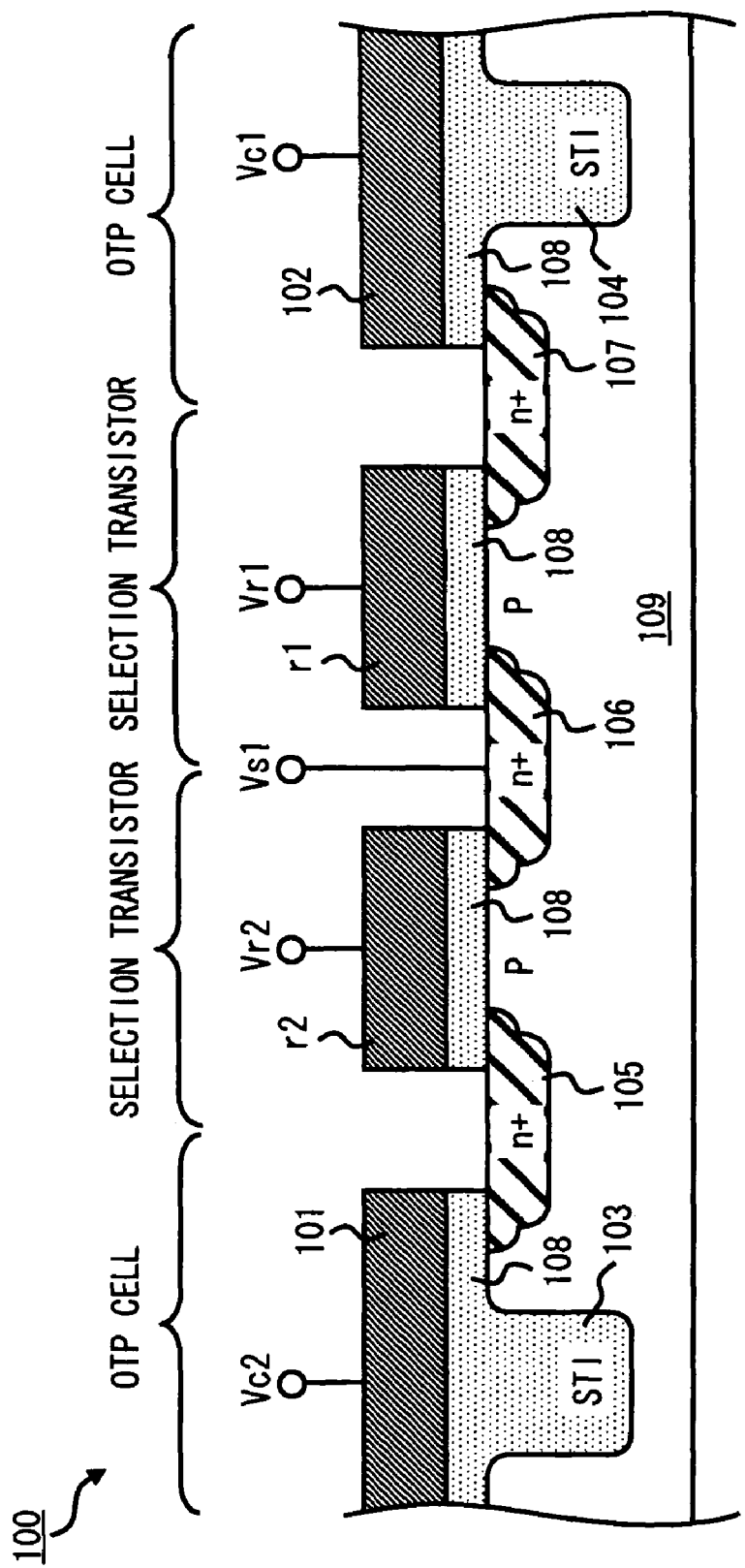
FIG. 47 is a cross-sectional diagram showing an OTP memory cell of a related art.

FIGS. 44A and 44B are cross-sectional diagrams each showing the OTP memory cell of the fifth embodiment. FIG.

44A is a cross-sectional diagram showing a portion taken along the line A-A of FIG. 43. FIG. 44B is a cross-sectional diagram showing a portion taken along the line B-B of FIG. 43. As shown in FIG. 44A, the selection transistor of the fifth embodiment has the source and the drain that are each made of a P-type semiconductor and formed in the upper portion of the substrate 30 made of an N-type semiconductor. The OTP cell has the lower electrode LE which is made of an N-type semiconductor and formed above the substrate 30 made of the N-type semiconductor via the isolation layer 39 made of a P-type semiconductor. As shown in FIG. 44B, a cross section viewed from the direction orthogonal to the channel direction of the selection transistor has the same shape as that of the selection transistor of the first embodiment.

On the other hand, as shown in FIG. 44A, the OTP cell is adjacent to the selection transistor with the trench-type insulating region STI interposed therebetween. The lower electrode LE is connected to the source S of the selection transistor via the line L. Also in this modified example, the lower electrode LE has the sharp portion 33. Accordingly, in a similar manner as in the first embodiment, the electric field is concentrated on the sharp portion 33, which lowers the breakdown withstand voltage of the OTP cell.

Next, regarding operations of the OTP memory cell, FIG. 45 shows the relation of voltages to be applied to terminals of the OTP memory cell during the writing operation. As shown in FIG. 45, in the fifth embodiment, the voltages to be applied to the terminals in each operation are negative voltages obtained by inverting the voltages applied in the third embodiment. However, an absolute value of each voltage to be applied to the terminals of the OTP memory cell in the fifth embodiment is equal to that of each voltage applied in the third embodiment. FIG. 46 shows the relation of the voltages to be applied to the terminals of the OTP memory cell during the reading operation. As shown in FIG. 46, also in this case, in a similar manner as in the writing operation, the reading operation can be performed with the negative voltages obtained by inverting the voltages applied in the third embodiment.

In other words, even when the PMOS transistor is formed as the selection transistor, the breakdown withstand voltage of the OTP memory can be lowered as in the third embodiment.

It is apparent that the present invention is not limited to the above embodiments, but may be modified and changed without departing from the scope and spirit of the invention. For example, the insulating film is not limited to the oxide film, and any insulating film can be used as long as the insulating film is made of a material having insulation properties. Further, the lower electrode can be made of a P-type semiconductor. In this case, the voltages at the terminals may be set so that the voltage at the lower electrode becomes higher than the voltage of the upper electrode when the OTP cell breaks down.

Note that in the scope of the present invention supported by the abovementioned embodiments of the present invention, the apparatuses and method listed in the following are included.

Other Embodiment of the Present Invention 1

A method of manufacturing a one time programmable (OTP) memory cell, the OTP memory cell including a first element forming region having a state memory cell and a first trench-type insulating region formed therein, and a second element forming region having a selection transistor and a second trench-type insulating region formed therein, the method comprising:

covering a semiconductor layer with a first insulating film having a first opening corresponding to a region having the first trench-type insulating region formed therein, and having a second opening corresponding to a region having the second trench-type insulating region formed therein;

forming a slope at an end of the second opening by removing a part of the semiconductor layer formed at a position corresponding to the second opening;

forming a second insulating film so as to cover a side wall of the first insulating film in the second opening;

forming a first trench and a second trench in the semiconductor layer at positions corresponding to the first opening and the second opening with the first insulating film and the second insulating film being used as a mask;

forming the first trench-type insulating region and the second trench-type insulating region by embedding an insulator in each of the first trench and the second trench;

removing the first insulating film and the second insulating film;

forming a lower electrode of the state memory cell by injecting impurities into a portion of the semiconductor layer, which is adjacent to the first trench-type insulating region;

forming a third insulating film on a surface of the semiconductor layer;

forming a conductor layer on each of the first trench-type insulating region and the third insulating film;

forming an upper electrode of the state memory cell above each of the lower electrode and the first trench-type insulating region adjacent to the lower electrode, by selectively removing the conductor layer, and forming a gate electrode of the selection transistor in the second element forming region;

selectively removing the third insulating film with the upper electrode and the gate electrode being used as a mask; and forming a source and a drain of the selection transistor.

Other Embodiment of the Present Invention 2

The method of manufacturing an OTP memory cell according to other embodiment of the present invention 1, further comprising forming a hollow along an outer periphery within the first trench-type insulating region by wet etching, before the forming of the third insulating film on the surface of the semiconductor layer.

Other Embodiment of the Present Invention 3

The method of manufacturing an OTP memory cell according to other embodiment of the present invention 1, further comprising forming a hollow in a side wall of the semiconductor layer, which is in contact with the first opening, by performing selective isotropic etching on a portion of the semiconductor layer corresponding to the first opening.

What is claimed is:

1. A one time programmable (OTP) memory cell including a state memory cell and a selection transistor, comprising:
a semiconductor substrate including:
a lower electrode forming region having a lower electrode of the state memory cell formed therein;
a diffusion layer forming region having a source and a drain of the selection transistor formed therein, wherein one of the source and the drain of the selection transistor is in electrical contact with the lower electrode;

a first trench-type insulating region adjacent to the lower electrode forming region; and a second trench-type insulating region adjacent to the diffusion layer forming region;

a first insulating film being in contact with the first trench-type insulating region and formed on the lower electrode;

an upper electrode of the state memory cell formed on the first insulating film;

a channel region extending between the source and the drain;

a second insulating film being in contact with the second trench-type insulating region and formed on the channel region; and a gate electrode of the selection transistor formed on the second insulating film, wherein a shape of at least a part of an end of the lower electrode forming region in contact with the first insulating film is sharper than a shape of an end of the channel region in contact with the second insulating film such that said sharper part is closer than a remaining part of said lower electrode to said upper electrode.

2. The OTP memory cell according to claim 1, wherein at least a part of a periphery of the lower electrode forming region has a top surface formed into a concave shape.

3. The OTP memory cell according to claim 1, wherein the lower electrode forming region has a hollow portion formed in a side wall on a side of the first trench-type insulating region.

4. The OTP memory cell according to claim 1, wherein the upper electrode projects to a side of the first trench-type insulating region in a region of an upper portion of the first trench-type insulating region, and has a projection formed between the end of the lower electrode forming region and the upper electrode with the first insulating film interposed therebetween.

5. The OTP memory cell according to claim 1, wherein the first insulating film formed on the lower electrode forming region near a central portion thereof is formed with a thickness substantially the same as a thickness of the second insulating film formed on the channel region near a central portion thereof.

6. The OTP memory cell according to claim 1, wherein the state memory cell stores one of a first memory state in which the end of the lower electrode forming region and the upper electrode are insulated from each other by the first insulating film, and a second memory state in which the end of the lower electrode forming region and the upper electrode are electrically short-circuited.

7. A one time programmable (OTP) memory including a bit line, a source line, a word line, a plurality of state memory cells each electrically connected with at least one of the bit line and the source line, and a plurality of selection transistors each electrically connected with the word line, the OTP memory comprising:

a semiconductor substrate including:
  a lower electrode forming region having a lower electrode of each of the plurality of state memory cells formed therein;
  a diffusion layer forming region having a source and a drain of each of the plurality of selection transistors formed therein, wherein one of the source and the drain of each of the plurality of selection transistors is electrically connected to the lower electrode of a corresponding one of the plurality of state memory cells;
  a first trench-type insulating region adjacent to the lower electrode forming region; and
  a second trench-type insulating region adjacent to the diffusion layer forming region;

a first insulating film being in contact with the first trench-type insulating region and formed on the lower electrode;

an upper electrode of each of the plurality of state memory cells formed on the first insulating film;

a channel region extending between the source and the drain;

a second insulating film being in contact with the second trench-type insulating region and formed on the channel region; and a gate electrode of each of the plurality of selection transistors formed on the second insulating film, wherein a shape of at least a part of an end of the lower electrode forming region in contact with the first insulating film is sharper than a shape of an end of the channel region in contact with the second insulating film such that said sharper part is closer than a remaining part of said lower electrode to said upper electrode.

8. The OTP memory according to claim 7, wherein:
the lower electrode is integrally formed with the drain of each of the plurality of selection transistors;
the upper electrode is connected to the bit line;
the gate electrode of each of the plurality of selection transistors is connected to the word line; and
the source of each of the plurality of selection transistors is connected to the source line.

9. The OTP memory according to claim 8, wherein the OTP memory is brought into a first memory state in which the end of the lower electrode forming region and the upper electrode are short-circuited, when the word line is in a selected state, the source line is supplied with a first voltage, and the bit line is supplied with a high voltage having a voltage value larger than that of the first voltage.

10. The OTP memory according to claim 7, wherein:
the upper electrode is connected to the source of each of the plurality of selection transistors;
the lower electrode is connected to the source line;
the gate electrode of the selection transistor is connected to the word line; and
the drain of each of the plurality of selection transistors is connected to the bit line.

11. The OTP memory according to claim 10, wherein the OTP memory is brought into a first memory state in which the end of the lower electrode forming region and the upper electrode are short-circuited, when the word line is in a selected state, the source line is supplied with a first voltage, and the bit line is supplied with a high voltage having a voltage value larger than that of the first voltage.

12. The OTP memory according to claim 8, wherein the lower electrode and the drain and the source of each of the plurality of selection transistors are each made of an N-type semiconductor.

13. The OTP memory according to claim 7, wherein:
the upper electrode is connected to the drain of each of the plurality of selection transistors;
the lower electrode is connected to the bit line;
the gate electrode of each of the plurality of selection transistors is connected to the word line; and
the source of each of the plurality of selection transistors is connected to the source line.

14. The OTP memory according to claim 13, wherein the OTP memory is brought into a first memory state in which the end of the lower electrode forming region and the upper electrode are short-circuited, when the word line is in a selected state, the source line is supplied with a first voltage, and the bit line is supplied with a low voltage having a voltage value smaller than that of the first voltage.

15. The OTP memory according to claim 13, wherein:
the lower electrode is made of an N-type semiconductor; and
the drain and the source of each of the plurality of selection transistors are each made of a P-type semiconductor.

16. The OTP memory according to claim 7, wherein:
the upper electrode is connected to the source line;
the lower electrode is connected to the source of each of the plurality of selection transistors;
the gate electrode of each of the plurality of selection transistors is connected to the word line; and
the drain of each of the plurality of selection transistors is connected to the bit line.

17. The OTP memory according to claim 16, wherein the OTP memory is brought into a first memory state in which the end of the lower electrode forming region and the upper electrode are short-circuited, when the word line is in a selected state, the source line is supplied with a first voltage, and the bit line is supplied with a low voltage having a voltage value smaller than that of the first voltage.

18. A one time programmable (OTP) memory cell including a state memory cell and a selection transistor, comprising:
a semiconductor substrate including:
a lower electrode forming region having a lower electrode of the state memory cell formed therein;
a diffusion layer forming region having a source and a drain of the selection transistor formed therein, wherein one of the source and the drain of the selection transistor is electrically connected to the lower electrode;
a first trench-type insulating region adjacent to the lower electrode forming region; and
a second trench-type insulating region adjacent to the diffusion layer forming region;
a first insulating film being in contact with the first trench-type insulating region and formed on the lower electrode;
an upper electrode of the state memory cell formed on the first insulating film;
a channel region extending between the source and the drain;
a second insulating film being in contact with the second trench-type insulating region and formed on the channel region; and
a gate electrode of the selection transistor formed on the second insulating film,
wherein a thickness of a portion of the first insulating film, which is formed on an end of the lower electrode, is smaller than a thickness of other portions of the first insulating film.

19. The OTP memory cell according to claim 18, wherein the thickness of the first insulating film decreases toward the end of the lower electrode.

20. The OTP memory cell according to claim 18, wherein the thickness of the portion of the first insulating film, which is formed on the end of the lower electrode, is smaller than a thickness of a portion of the second insulating film, which is formed on an end of the channel region.

21. The OTP memory cell according to claim 18, wherein the lower electrode forming region has a hollow portion formed in a side wall on a side of the first trench-type insulating region.

22. The OTP memory cell according to claim 18, wherein the upper electrode projects to a side of the first trench-type insulating region in a region of an upper portion of the first trench-type insulating region, and has a projection formed between the end of the lower electrode forming region and the upper electrode with the first insulating film interposed therebetween.

* * * * *